United States Patent
Kim et al.

(10) Patent No.: US 9,793,871 B1
(45) Date of Patent: Oct. 17, 2017

(54) APPARATUS AND METHOD FOR CONTROLLING WIRELESS TRANSMISSION

(71) Applicant: SAMSUNG ELECTRONICS CO., LTD., Suwon-si, Gyeonggi-Do (KR)

(72) Inventors: Dong-Su Kim, Suwon-si (KR); Tae-Ui Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/436,270

(22) Filed: Feb. 17, 2017

(30) Foreign Application Priority Data

Dec. 23, 2016  (KR) ........................ 10-2016-0177946

(51) Int. Cl.
| H04B 7/00 | (2006.01) |
| H03G 3/30 | (2006.01) |
| H03F 3/24 | (2006.01) |
| H03F 3/19 | (2006.01) |
| H03F 1/02 | (2006.01) |
| H04B 1/04 | (2006.01) |
| H04B 17/13 | (2015.01) |

(52) U.S. Cl.
CPC .............. *H03G 3/3042* (2013.01); *H03F 1/02* (2013.01); *H03F 3/19* (2013.01); *H03F 3/245* (2013.01); *H04B 1/04* (2013.01); *H04B 17/13* (2015.01); *H03F 2200/451* (2013.01); *H04B 2001/0416* (2013.01)

(58) Field of Classification Search
CPC ........ H03G 3/3042; H04B 17/13; H04B 1/04; H03F 1/02; H03F 3/19
USPC ......................... 455/67.11, 522, 114.3, 115.1
See application file for complete search history.

(56) References Cited

U.S. PATENT DOCUMENTS

| 7,034,612 B2 | 4/2006 | Kim |
| 7,058,425 B1 | 6/2006 | Takakusaki |
| 7,103,029 B1 | 9/2006 | Minowa |
| 7,567,788 B2 | 7/2009 | Newton et al. |
| 7,915,969 B2 | 3/2011 | Shimizu et al. |
| 8,326,340 B2 * | 12/2012 | Nalbantis ............... H04W 52/08 455/114.3 |

(Continued)

FOREIGN PATENT DOCUMENTS

| JP | 2011-120067 | 6/2011 |
| KR | 10-2010-0137000 | 12/2010 |
| KR | 10-1526579 | 6/2015 |

*Primary Examiner* — Sonny Trinh

(74) *Attorney, Agent, or Firm* — F. Chau & Associates, LLC

(57) ABSTRACT

An apparatus and method for controlling wireless transmission. The apparatus, which controls a transmitter that provides an output signal by upconverting and amplifying an input signal, includes a memory configured to store first calibration data representing a saturation power and a linear gain of a reference transmitter as functions of operating conditions of the reference transmitter. A controller may be configured to estimate a saturation power and a linear gain of the transmitter of the apparatus based on operating conditions of the transmitter and the first calibration data. The controller may generate at least one control signal for controlling an operation of the transmitter based on a saturation power difference between the estimated saturation power and a target saturation power and a linear gain difference between the estimated linear gain and a target linear gain.

20 Claims, 24 Drawing Sheets

(56) References Cited

U.S. PATENT DOCUMENTS

| | | | |
|---|---|---|---|
| 8,344,806 B1* | 1/2013 | Franck | H03F 1/0227 |
| | | | 330/285 |
| 8,565,699 B1 | 10/2013 | Lipshitz et al. | |
| 8,611,402 B2 | 12/2013 | Chiron | |
| 8,626,091 B2 | 1/2014 | Khlat et al. | |
| 9,432,948 B2* | 8/2016 | Milotta | H04B 7/10 |
| 9,509,348 B1* | 11/2016 | Daminski | H03J 1/0083 |
| 2007/0109955 A1* | 5/2007 | Moorti | H03G 3/3042 |
| | | | 370/206 |
| 2009/0072900 A1 | 3/2009 | Park et al. | |
| 2009/0256630 A1 | 10/2009 | Brobston | |
| 2016/0249300 A1 | 8/2016 | Tsai et al. | |

* cited by examiner

P_DIF4 = P_DIF1 + P_DIF2 + P_DIF3
G_DIF4 = G_DIF1 + G_DIF2 + G_DIF3

G_ERR4 = G_DIF4 + G_OFF4

APPARATUS AND METHOD FOR CONTROLLING WIRELESS TRANSMISSION

CROSS-REFERENCE TO RELATED APPLICATIONS

This application claims the benefit of priority from Korean Patent Application No. 10-2016-0177946, filed on Dec. 23, 2016, in the Korean Intellectual Property Office, the disclosure of which is incorporated by reference herein.

TECHNICAL FIELD

The inventive concept relates to wireless communication, and more particularly, to an apparatus and method for controlling wireless transmission.

DISCUSSION OF THE RELATED ART

Wireless transmission may be achieved by outputting a signal generated by processing data to be transmitted, e.g., source data, through an antenna. For example, source data may be processed by operations such as encoding, modulation, digital-to-analog-conversion, upconversion, amplification, and the like. Digital or analog signals may be processed. In the processing of an analog signal for wireless transmission, the performance may vary due to various factors, and such variations of the performance may impact the efficiency of wireless transmission.

SUMMARY

The inventive concept provides an apparatus and method for controlling wireless transmission that may compensate for variations occurring in wireless transmission in a wireless communication system.

According to an aspect of the inventive concept, an apparatus for controlling a transmitter a controller; a transmitter coupled to the controller, in which the transmitter includes RF circuits that receive a baseband input signal of a source data and increases a frequency of the baseband input signal to an RF signal band that is amplified by a power amplifier to generate an output signal; a memory configured to store first calibration data representing a saturation power and a linear gain of a reference device according to a plurality of operating conditions of the reference device; and wherein the controller receives input information about operating conditions of the transmitter, and in which the controller is configured to estimate a linear gain and a saturation power of the transmitter based on the operating conditions of the transmitter and the first calibration data, and wherein the controller generates at least one control signal to control an operation of the transmitter based on a saturation power difference between the estimated saturation power and a target saturation power and a linear gain difference between the estimated linear gain and a target linear gain.

According to another aspect of the inventive concept, the reference device may be a reference transmitter.

According to another aspect of the inventive concept, a method for controlling a transmitter of an apparatus which provides an output signal by upconverting and amplifying an input signal, may include the operations of accessing first calibration data representing a linear gain and a saturation power of a reference transmitter according to operating conditions of the reference transmitter; estimating a saturation power and a linear gain of the transmitter of the apparatus based on operating conditions of the transmitter of the apparatus and the first calibration data of the reference transmitter; calculating a saturation power difference between the estimated saturation power and a target saturation power; calculating a linear gain difference between the estimated linear gain and a target linear gain; and generating at least one control signal to control an operation of the transmitter of the apparatus based on the calculated saturation power difference and the calculated linear gain difference.

According to another aspect of the inventive concept, a user equipment (UE) that controls wireless transmissions includes: a transmitter including at least one RF circuit; a data processor coupled to the transmitter and includes circuitry that generates an input signal to the transmitter; a memory configured to store calibration data representing a linear gain of a reference device and a saturation power at which the linear gain decreases from a maximum under one or more operating conditions; a controller that is coupled to the transmitter, the controller generates a control signal output to the transmitter, in which the control signal adjusts operation of the transmitter based on one or more operating conditions of the transmitter and a calibration data of the reference device; and wherein the controller generates at least one control signal to control an operation of the transmitter based on a saturation power difference between an estimated saturation power and a target saturation power and a linear gain difference between an estimated linear gain and a target linear gain.

The calibration data may include data obtained from testing the reference device under a plurality of operational conditions.

The reference device may include a reference transmitter manufactured by a same process as that of the transmitter of the UE.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
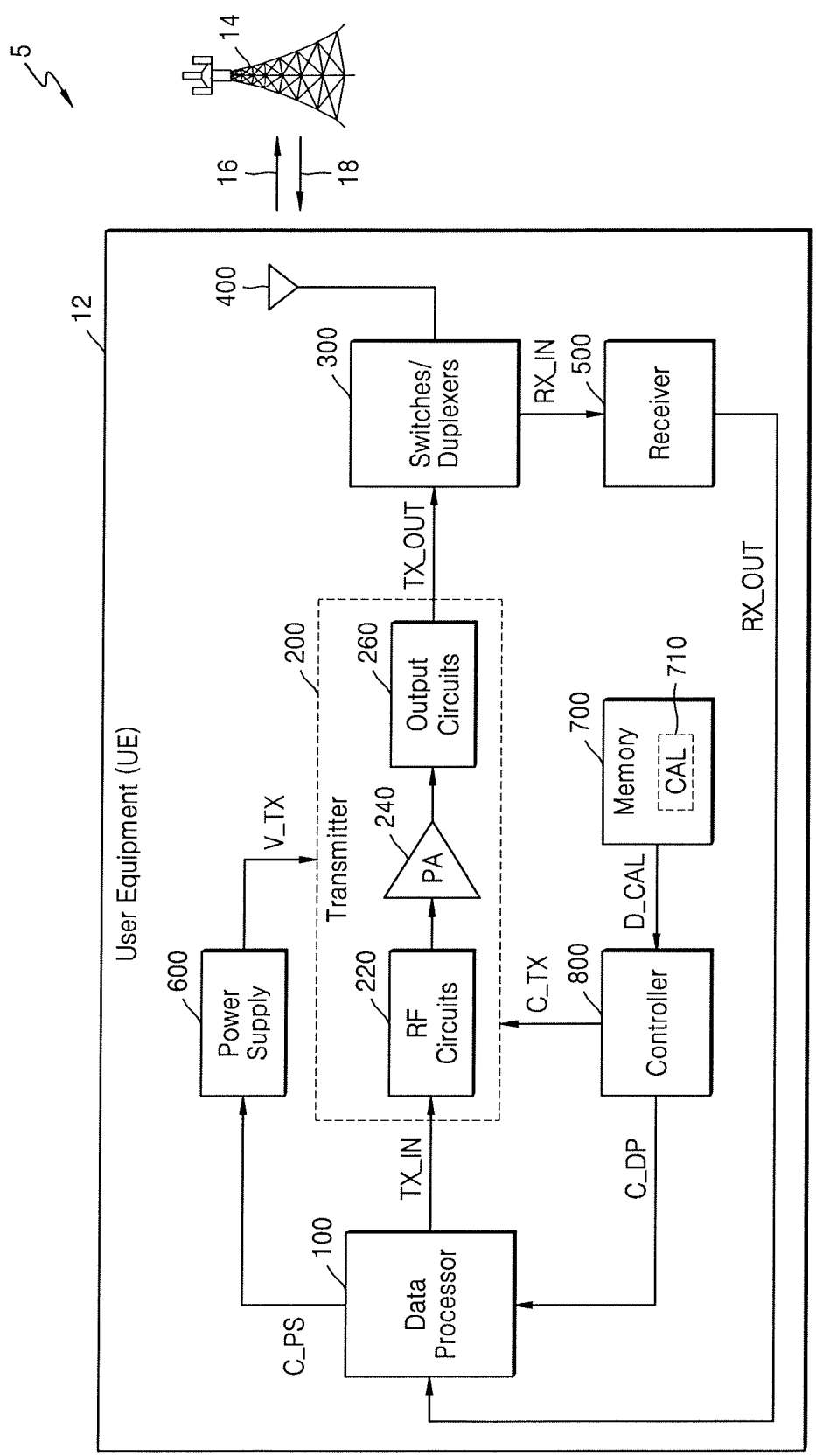
FIG. 1 is a block diagram illustrating a wireless communication system including a user equipment and a base station according to an exemplary embodiment of the inventive concept.

FIG. 1 is a block diagram illustrating a wireless communication system 5 including a user equipment (UE) 12 and a base station (BS) 14 according to an exemplary embodiment of the inventive concept. As illustrated in FIG. 1, the UE 12 and the BS 14 may wirelessly communicate with each other through, for example, an uplink (UL) 16 and a downlink (DL) 18.

The wireless communication system 5 may be a Long-Term Evolution (LTE) system, a code division multiple access (CDMA) system, a Global System for Mobile Communications (GSM) system, a wireless local area network (WLAN) system, or another wireless communication system as a non-limiting example. The UE 12, which is a wireless communication device, may be fixed or may be movable, and the term UE may refer to various types of devices which may communicate with the BS 14 to transmit and receive data and/or control information. For example, the UE 12 may be referred to as a terminal equipment, a mobile station (MS), a mobile terminal (MT), a user terminal (UT), a subscribe station (SS), a wireless device, a handheld device, or the like, to name some possible non-limiting examples of devices. The term "BS" may generally refer to a fixed station which communicates with the UE and/or another BS, and may exchange data and control information by communicating with the UE and/or another BS. For example, the BS 14 may be referred to as a node B, an evolved-Node B (eNB), a base transceiver system (BTS), an access point (AP), or the like, to name some possible non-limiting examples.

The wireless communication network between the UE 12 and the BS 14 may support the communication of multiple users by sharing available network resources. For example, in the wireless communication network, information may be transferred in various protocols such as CDMA, frequency division multiple access (FDMA), time division multiple access (TDMA), orthogonal frequency division multiple access (OFDMA), single carrier frequency division multiple access (SC-FDMA), and the like.

Referring to FIG. 1, the UE 12 may include a data processor 100, a transmitter 200, switches/duplexers 300, an antenna 400, a receiver 500, a power supply 600, a memory 700, and a controller 800. Although the transmitter 200, the switches/duplexers 300, and the receiver 500 are illustrated as being separated from each other in FIG. 1, the transmitter 200, the switches/duplexers 300, and the receiver 500 may be implemented as a single transceiver, and the data processor 100 and the controller 800 may be implemented as a single modem. Hereinafter, although exemplary embodiments of the inventive concept may be described with reference to the UE 12, it will be understood that the embodiment of the inventive concept may be applied to the BS 14 which performs wireless transmission through the DL 18.

The data processor 100, which may include circuitry configured for operation, may generate a transmitter input signal TX_IN by processing data to be transmitted to the BS 14, e.g., source data. For example, the data processor 100 may encode and modulate source data and generate a transmitter input signal TX_IN which is an analog signal by performing digital-to-analog conversion on a modulated signal. The transmitter input signal TX_IN may be referred to as a baseband signal. Further, as described below with reference to FIGS. 5A and 5B, the data processor 100 may further perform digital pre-distortion (DPD) to compensate for characteristics (e.g., nonlinearity of a gain) of the transmitter 200.

The data processor 100 may generate a transmitter power control signal C_PS which controls the power supply 600 which supplies (e.g. outputs) power to the transmitter 200. For example, the data processor 100 may control a transmitter voltage (or a transmitter supply voltage) V_TX supplied to the transmitter 200 through the transmitter power control signal C_PS to improve efficiency of the transmitter 200a. For example, as described below with reference to FIG. 5A, the data processor 100a may estimate an average power of a transmitter output signal TX_OUT from the transmitter input signal TX_IN and increase or decrease the transmitter voltage V_TX according to the estimated average power.

Further, for example, as described below with reference to FIG. 5B, the data processor 100b may estimate an instantaneous power of the transmitter output signal TX_OUT from the transmitter input signal TX_IN and instantaneously increase or decrease the transmitter voltage VTX according to the estimated instantaneous power.

The data processor 100 may generate a transmitter power control signal C_PS for controlling the transmitter supply voltage V_TX based on a data processor control signal C_DP provided by the controller 800. For example, the data processor 100 may control the transmitter voltage V_TX based on an output power of the transmitter 200 and the data processor control signal C_DP. As described below with reference to FIG. 7 and the like, the controller 800 may compensate for performance variation of the transmitter 200 due to operating conditions of the transmitter 200 by using the transmitter voltage V_TX. The transmitter 200 may generate a transmitter output signal TX_OUT in a radio frequency (RF) band from a transmitter input signal TX_IN in a baseband. As illustrated in FIG. 1, the transmitter 200 may include RF circuits 220, a power amplifier 240, and output circuits 260.

The RF circuits 220 may amplify and filter the transmitter input signal TX_IN, and upconvert (e.g. increase the frequency from a relatively low frequency to a higher frequency in an RF band) the transmitter input signal TX_IN in the baseband into a signal in an RF band to output the RF signal.

The term "upconverting" as disclosed in at least one exemplary embodiment herein in may be understood as a changing of the frequency of an input signal to another band, for example, from a baseband signal (e.g. an input signal in its original frequency prior to being modulated to a different frequency) to another frequency band, for example, an RF band. The input signal TX_IN may be used by the RF circuits 220 to modulate a carrier signal having an RF frequency.

With further regard to upconverting, for example, the RF circuits 220 may include mixers, amplifiers, filters, a matching circuit, an oscillator, a local oscillator (LO) generator, a phase locked loop (PLL), or the like to name some non-limiting possible examples of circuitry that may upconvert the input signal TX_IN. A mixer may have one input port that receives the baseband signal, another input port that receives an output generated at a desired frequency by the LO, and an output port that outputs the sum and the difference in the frequency of the input ports. An operational amplifier, for example, with weighted inputs for the LO and the baseband input signal can provide upconverting of the baseband signal to an RF band signal.

Figure 2A:
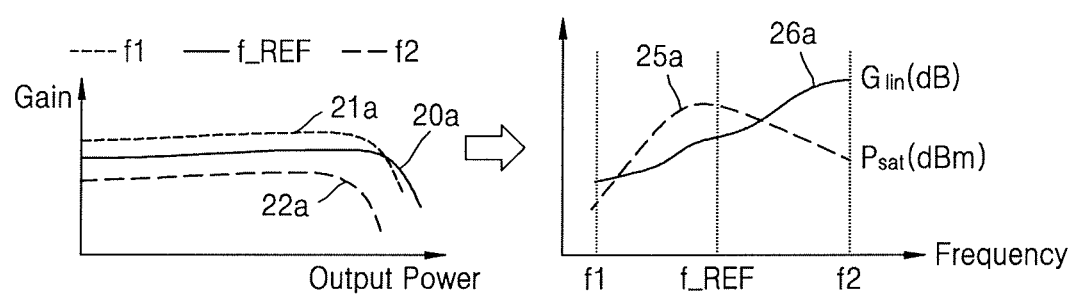
FIGS. 2A to 2D are graphs illustrating performance variations of a transmitter having operating conditions according to an exemplary embodiment of the inventive concept.
Figure 2B:
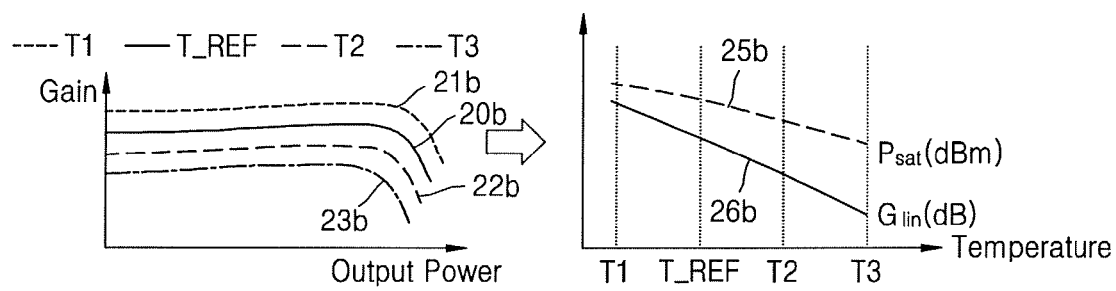
Figure 2C:
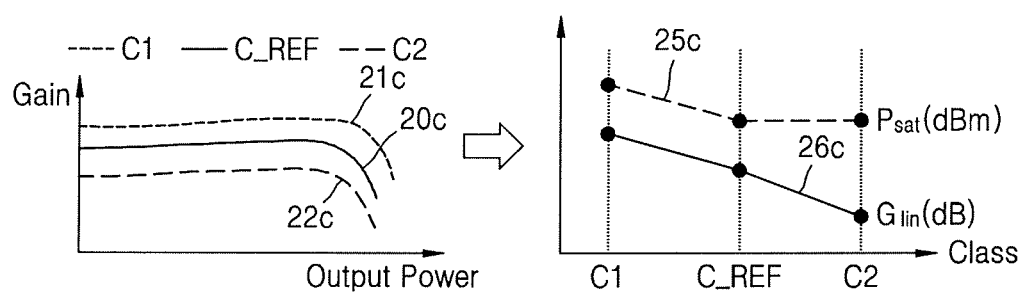
Figure 2D:
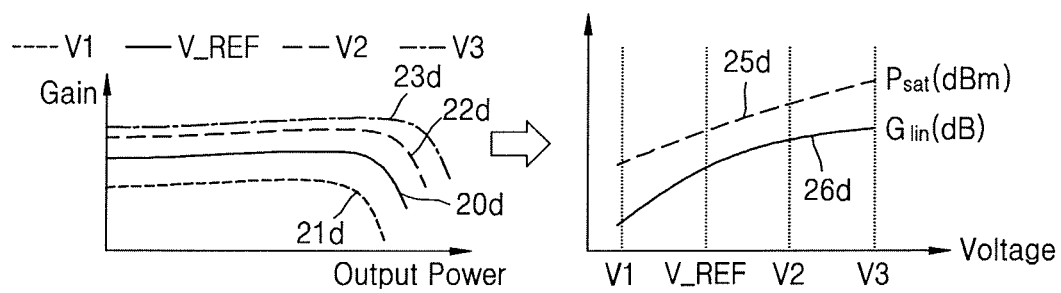
Figure 2E:
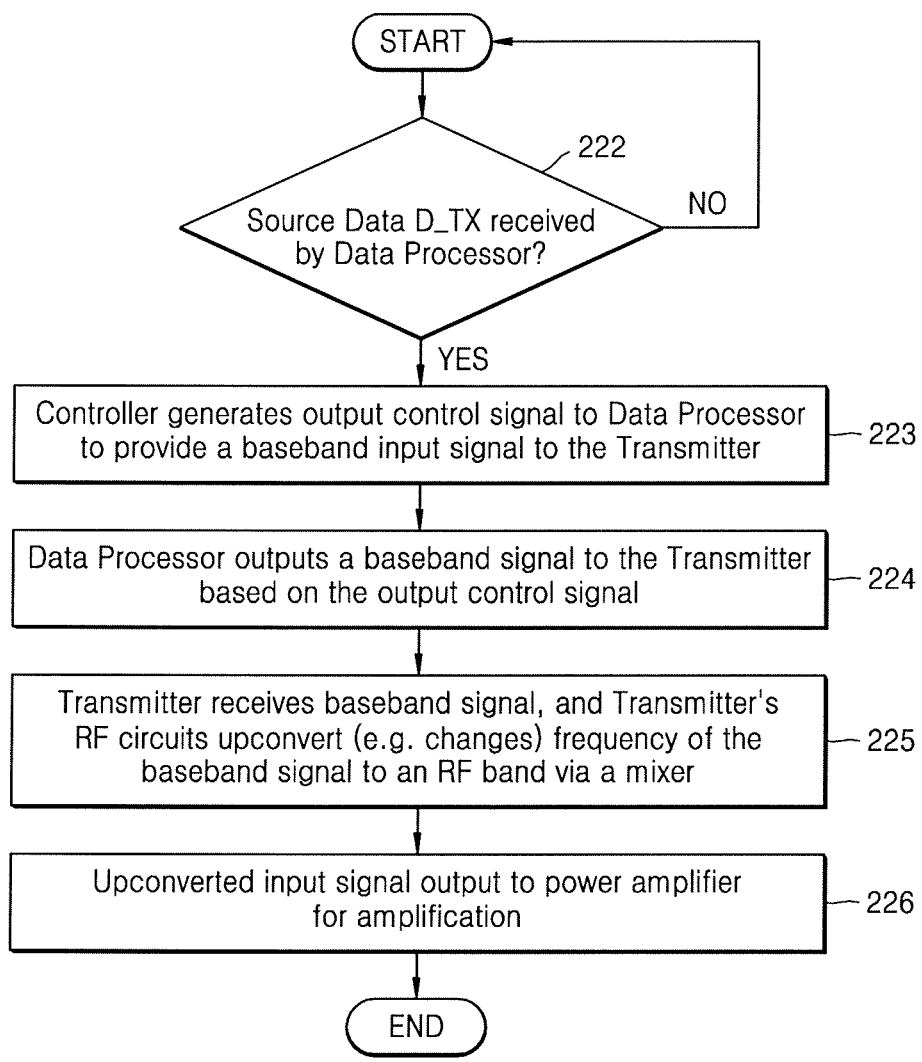
FIG. 2E is a flowchart providing an overview of upconverting of an input baseband signal to an RF signal band according to an exemplary embodiment of the inventive concept.

With reference to FIG. 2E, a flowchart providing an overview of an upconverting operation of an input baseband signal to an RF signal band according to an exemplary embodiment of the inventive concept will now be discussed.

At operation 222, the upconverting operation begins. A data processor (for example, DP 100 shown in FIG. 1) determines whether a source data (e.g. D_TX) has been received, and proceeds to operation 223 in response to receiving the source data.

At operation 223, a controller (e.g. controller 800) generates an output control signal to the DP 100 that instructs the DP 100 to provide a baseband input signal containing the source data to the transmitter (e.g. transmitter 200).

At operation 224, the DP 100 outputs the baseband signal (e.g. TX_IN) to the transmitter.

At operation 225, the transmitter receives the baseband signal that is processed by the transmitter's RF circuitry (e.g. RF circuits 220). The RF circuits may include, for an example, mixers, an oscillator, a local oscillator (LO) generator, a phase-locked loop (PLL), etc. The RF circuits upconvert (e.g. increases, modulates) the frequency of the baseband signal to an RF frequency band.

At operation 226, the upconverted input signal may be output from the RF circuits to a power amplifier (PA). An artisan should understand and appreciate that additional components (e.g. filters) may be arranged between components of the transmitter described above.

The power amplifier 240 may generate an amplified RF signal having an appropriate output power level by amplifying the RF signal received from the RF circuits 220. The power amplifier 240 may receive the transmitter voltage V_TX received from the power supply 600, and the output power level of the amplified RF signal may be adjusted according to the transmitter voltage V_TX.

The output circuits 260 may receive the RF signal amplified by the power amplifier 240 and output the transmitter output signal TX_OUT. For example, the output circuits 260 may include a matching circuit, a transmission filter, a directional coupler, or the like.

With continued reference to FIG. 1, the performance of the transmitter 200 may vary according to operating conditions. For example, as described above, the transmitter 200, which processes the transmitter input signal TX_IN which is an analog signal, may include various components, and the components included in the transmitter 200 may have deviations, e.g., characteristic differences, from components included in other transmitters. Further, due to a temperature of the transmitter 200, a carrier frequency included in the transmitter output signal TX_OUT, and the transmitter voltage V_TX supplied to the transmitter 200, the performance of the transmitter 200, for example, a relationship between the gain and the output power of the transmitter 200 may vary according to such operating conditions of the transmitter 200 as described below with reference to FIGS. 2A to 2D. According to the exemplary embodiment of the inventive concept, a linear gain and saturation power of the transmitter 200 according to the operating conditions of the transmitter 200 may be modeled, and the controller 800 may control the transmitter 200 by estimating a current linear gain and saturation power of the transmitter 200 based on current operating conditions of the transmitter 200.

The switches/duplexers 300 may route the transmitter output signal TX_OUT and a receiver input signal RX_IN. For example, the switches/duplexers 300 may route the transmitter output signal TX_OUT to the transmitter output signal TX_OUT to the antenna 400, and route a signal received through the antenna 400 to transfer the signal to the receiver 500 as a receiver input signal RX_IN.

The receiver 500 may receive the receiver input signal RX_IN from the switches/duplexers 300, and process, for example, amplify, filter, and downconvert the receiver input signal RX_IN. For example, the receiver 500 may include a matching circuit, a filter, a low noise amplifier (LNA), a mixer, an oscillator, a LO generator, a PLL, or the like.

The power supply 600 may supply the transmitter voltage V_TX to provide power to the transmitter 200. The power supply 600 may provide the transmitter voltage V_TX based on the transmitter power control signal C_PS provided from the data processor 100. For example, the power supply 600 may include a direct current-to-direct current (DC-to-DC) converter as described below with reference to FIG. 5A, or include a power modulator as described below with reference to FIG. 5B.

The memory 700 may store calibration data 710. The calibration data 710 may be obtained in advance by testing a reference transmitter and may be stored in the memory 700. An artisan understands and appreciates that the testing of a reference transmitter is not the only way to obtain calibration data, and for example, a computer simulation of a reference device may be a basis for obtaining calibration data. The reference transmitter may be different than the transmitter 200 shown in FIG. 1. The reference transmitter (not shown) may be manufactured by the same process as the transmitter 200, or may be the transmitter 200 that is included in the UE 12 and controlled by the controller 800. For example, in an embodiment of the inventive concept, the calibration data 710 may be data obtained by testing at least one sample of transmitters manufactured by the same process as that of the transmitter 200, or may be data obtained by testing the transmitter 200, which is included in the UE 12 (with the controller 800) and controlled by the controller 800. Details of the calibration data 710 will be described with reference to FIGS. 3 and 4.

The controller 800 may generate at least one control signal (e.g., C_DP or C_TX) for controlling the transmitter 200 by referring to the calibration data 710 stored in the memory 700. For example, the calibration data 710 may include first calibration data (e.g., 711 of FIG. 3A) representing a saturation power and linear gain of a reference transmitter as functions of operating conditions of the reference transmitter. The controller 800 may estimate the saturation power and linear gain of the transmitter 200 based on the operating conditions of the transmitter 200 and the first calibration data. The controller 800 may generate at least one control signal for controlling an operation of the transmitter 200 based on a saturation power difference between the estimated saturation power and a target saturation power and a linear gain difference between the estimated linear gain and a target linear gain. Thus, the controller 800 may accurately compensate for variations of the performance of the transmitter 200 due to the operating conditions of the transmitter 200, and the efficiency of the transmitter 200, e.g., efficiency of wireless transmission in the UE 12, may be improved. Further, the variations of the performance of the transmitter 200 may be compensated rapidly at a low cost without using feedback data obtained by assessing the transmitter output signal TX_OUT and the like (i.e., without a feedback loop). The controller 800 may include a processor for executing instructions and control the transmitter 200 by executing a series of instructions loaded into the memory (e.g., 700 of FIG. 1). Further, the controller 800 may include a logic circuit generated through logic synthesis or the like and control the transmitter 200 through a state machine.

FIGS. 2A to 2D are graphs illustrating performance variations of the transmitter 200 of FIG. 1 in accordance with operating conditions of the transmitter 200 according to an exemplary embodiment of the inventive concept. As described above with reference to FIG. 1, the transmitter 200 may exhibit a different performance characteristic(s) according to operating conditions. A carrier frequency of a transmitter output signal, a temperature of a transmitter, a class of a semiconductor device (or a chip) included in the transmitter, and a voltage of the transmitter, which are illustrated in FIGS. 2A to 2D, are only some examples of the operating conditions of the transmitter 200 that can impact performance. Although the exemplary embodiments of the inventive concept described below will be described as using the operating conditions illustrated in FIGS. 2A to 2D, it will be understood that other operating conditions of the transmitter 200 may be used. Hereinafter, FIGS. 2A to 2D will be described with reference to FIG. 1.

Referring to FIG. 2A, the transmitter 200 may have a different performance according to a carrier frequency of the transmitter output signal TX_OUT. For example, as illustrated in FIG. 2A, in a graph of an output power with respect to a gain of the transmitter 200, different lines 20a, 21a, and 22a may be observed according to different frequencies f_REF, f1, and f2. In this example, as illustrated in the graph of the output power with respect to the gain of FIG. 2A, the lines 20a, 21a, and 22a according to the frequencies f_REF, f1, and f2 may be arranged at different positions and may have substantially the same shape. Therefore, a relationship between the gain and the output power of the transmitter 200 corresponding to the carrier frequency of the transmitter output signal TX_OUT may be characterized by a linear gain $G_{lin}$ and a saturation power $P_{sat}$. The linear gain $G_{lin}$ may be defined as a gain of a specific output power at a low output power, and the saturation power $P_{sat}$ may be defined as a specific output power at which a linear gain decreases (e.g., an output power corresponding to a gain reduced by −2 dB from a maximum gain). Thus, as illustrated in a right graph of FIG. 2A, lines 25a and 26a respectively represent a linear gain $G_{lin}$ and a saturation power $P_{sat}$ of the transmitter 200 according to the carrier frequency of the transmitter output signal TX_OUT may be derived by testing the transmitter 200 (or the reference transmitter).

Referring to FIG. 2B, the transmitter 200 may have a different performance according to a temperature of the transmitter 200. For example, as illustrated in FIG. 2B, in a graph of an output power with respect to a gain of the transmitter 200, different lines 20b, 21b, 22b, and 23b may be observed according to different temperatures T_REF, T1, T2, and T3. In this case, as illustrated in the graph of the output power with respect to the gain of FIG. 2B, the lines 20b, 21b, 22b, and 23b according to the temperatures T_REF, T1, T2, and T3 may be arranged at different positions and may have substantially the same shape. Thus, as illustrated in a right graph of FIG. 2B, lines 25b and 26b respectively represent a linear gain $G_{lin}$ and a saturation power $P_{sat}$ of the transmitter 200 according to the temperature of the transmitter 200 may be derived by testing the transmitter 200 (or the reference transmitter) at various temperatures.

Referring to FIG. 2C, the transmitter 200 may have different characteristics according to a class of a semiconductor device (or a chip) included in the transmitter 200. For example, at least one of the RF circuits 220, the power amplifier 240, and the output circuits 260 which are included in the transmitter 200 may be implemented as a semiconductor device (or a chip). Semiconductor devices may have different characteristics due to process variations or the like despite being manufactured through the same manufacturing process, and thus the characteristics of the transmitter 200 including a semiconductor device may be different from those of another transmitter including another semiconductor device.

Semiconductor devices manufactured through the same manufacturing process may be classified according to their characteristics. For example, the semiconductor devices may be classified by assessing their characteristics by a test included in the manufacturing process and class information may be stored. Alternatively, the characteristics of the semiconductor device may be assessed by being tested by another component (e.g., the controller 800 of FIG. 1) in a system (e.g., the UE 12 of FIG. 1) including the semiconductor device, and class information of the semiconductor device may be obtained according to the assessed characteristics.

As illustrated in FIG. 2C, for example, semiconductor devices included in the transmitter 200 may be classified into three classes C_REF, C1, and C2, and different lines 20c, 21c, and 22c may be observed according to the three classes C_REF, C1, and C2 in a graph of an output power with respect to a gain of the transmitter 200. In this case, as illustrated in the graph of the output power with respect to the gain of FIG. 2C, the lines 20c, 21c, and 22c according to the three classes C_REF, C1, and C2 may be arranged at different positions and may have substantially the same shape. Thus, as illustrated in a right graph of FIG. 2C, lines 25c and 26c respectively represent a linear gain $G_{lin}$ and a saturation power $P_{sat}$ of the transmitter 200 according to the class of the semiconductor device included in the transmitter 200 may be provided.

Referring to FIG. 2D, the transmitter 200 may have different characteristics according to the transmitter voltage V_TX supplied to the transmitter 200. For example, as illustrated in FIG. 2D, in a graph of an output power with respect to a gain of the transmitter 200, different lines 20d, 21d, 22d, and 23d may be observed according to different voltages V_REF, V1, V2, and V3. In this case, as illustrated in the graph of the output power with respect to the gain of FIG. 2D, the lines 20d, 21d, 22d, and 23d according to the voltages V_REF, V1, V2, and V3 may be arranged at different positions and may have substantially the same shape. Thus, as illustrated in a right graph of FIG. 2D, lines 25d and 26d respectively represent a linear gain $G_{lin}$ and a saturation power $P_{sat}$ of the transmitter 200 according to the transmitter voltage V_TX of the transmitter 200 that may be derived by testing the transmitter 200 (or the reference transmitter).

In FIGS. 2A to 2D, the reference frequency f_REF, the reference temperature T_REF, the reference class C_REF, and the reference voltage V_REF may be referred to as reference operating conditions of the reference transmitter. For example, the reference transmitter may include a semiconductor device belonging to the reference class C_REF. When a carrier frequency of an output signal provided by the reference transmitter is the reference frequency f_REF, a temperature of the reference transmitter is the reference temperature T_REF, and a supply voltage provided to the reference transmitter is the reference voltage V_REF, characteristics of the reference transmitter may be represented by the lines 20a, 20b, 20c, and 20d of respective FIGS. 2A to 2D in the graphs of the output power with respect to the gain.

As described above, a relationship between the output power and the gain according to the operating conditions of the transmitter 200 may be characterized by the linear gain $G_{lin}$ and the saturation power $P_{sat}$. Thus, the memory 700 of FIG. 1 may store the linear gain $G_{lin}$ and the saturation power $P_{sat}$ according to the operating conditions of the transmitter 200 as calibration data. For example, the linear gain $G_{lin}$ and the saturation power $P_{sat}$ among values representing the characteristics of the transmitter 200 may be stored as calibration data and the transmitter 200 may be controlled based on the calibration data.

Figure 3A:
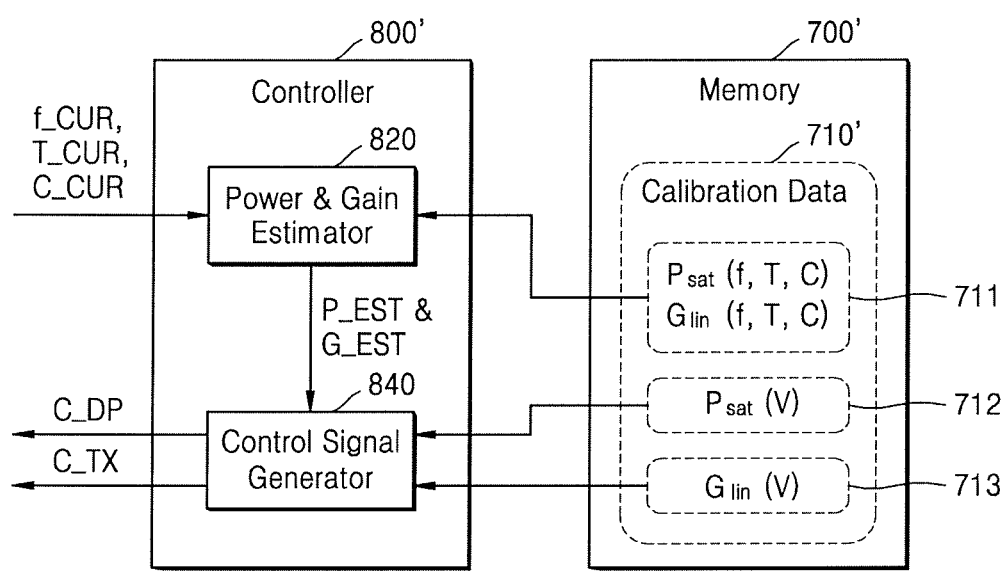
FIG. 3A is a block diagram illustrating examples of a memory and a controller of a user equipment according to an exemplary embodiment of the inventive concept.

FIG. 3A is a block diagram illustrating examples of the memory 700 and the controller 800 of FIG. 1 according to an exemplary embodiment of the inventive concept. As described above with reference to FIG. 1, a memory 700' of FIG. 3A may store calibration data 710' and a controller 800' may generate at least one of control signals C_DP and C_TX for controlling the transmitter 200 of FIG. 1 based on the calibration data 710'.

Referring to FIG. 3A, the calibration data 710' stored in the memory 700' may include first calibration data 711, second calibration data 712, and third calibration data 713. The first calibration data 711 may represent a saturation power $P_{sat}$ and a linear gain $G_{lin}$ of a reference transmitter as functions of operating conditions of the reference transmitter. For example, as illustrated in FIG. 3A, the first calibration data 711 may include functions '$P_{sat}$(f, T, C)' and '$G_{lin}$(f, T, C)' respectively representing the saturation power $P_{sat}$ and the linear gain $G_{lin}$ of the reference transmitter as functions of a carrier frequency f of an output signal provided by the reference transmitter, a temperature T of the reference transmitter, and a class C according to characteristics of a semiconductor device of the reference transmitter. For example, the function '$P_{sat}$(f, T, C)' may correspond to the lines 25a, 25b, and 25c illustrated in respective FIGS. 2A to 2C and the function '$G_{lin}$(f, T, C)' may correspond to the lines 26a, 26b, and 26c illustrated in respective FIGS. 2A to 2C. The memory 700' may store values of the saturation power $P_{sat}$ and the linear gain $G_{lin}$ corresponding to a plurality of values of respective operating conditions f, T, and C in a form of a lookup table, and store information on coefficients and equations used to calculate the saturation power $P_{sat}$ and the linear gain $G_{lin}$ from the operating conditions f, T, and C. Thus, the linear gain $G_{lin}$ and the saturation power $P_{sat}$ of the transmitter 200 may be estimated from current operating conditions of the transmitter 200 from the first calibration data 711.

The second calibration data 712 may include a function '$P_{sat}$(V)' representing the saturation power $P_{sat}$ of the reference transmitter as a function of a supply voltage V provided to the reference transmitter. For example, the function '$P_{sat}$(V)' may correspond to the line 25d illustrated in FIG. 2D. Similar to the first calibration data 711, the memory 700' may store values of the saturation power $P_{sat}$ corresponding to a plurality of values of the supply voltage V in a form of a lookup table, and store information on coefficients and equations used to calculate the saturation power $P_{sat}$ from the supply voltage V.

The third calibration data 713 may include a function '$G_{lin}$(V)' representing the linear gain $G_{lin}$ of the reference transmitter as a function of the supply voltage V provided to the reference transmitter. For example, the function '$G_{lin}$(V)' may correspond to the line 26d illustrated in FIG. 2D. Similar to the first calibration data 711, the memory 700' may store values of the linear gain $G_{lin}$ corresponding to a plurality of values of the supply voltage V in a form of a lookup table, and store information on coefficients and equations used to calculate the linear gain $G_{lin}$ from the supply voltage V.

With continued reference to FIG. 3A, the controller 800' may include a power and gain estimator 820 and a control signal generator 840. The power and gain estimator 820 and control signal generator 840 may include integrated circuitry (e.g., a processor). The power and gain estimator 820 may receive current operating conditions f_CUR, T_CUR, and C_CUR of the transmitter 200 and generate an estimated saturation power P_EST and an estimated linear gain G_EST of the transmitter 200 by referring to the first calibration data 711. For example, the power and gain estimator 820 may receive a carrier frequency f_CUR used for upconversion of the transmitter input signal TX_IN, a temperature T_CUR of the transmitter 200 detected from a temperature sensor or the like, and a class C_CUR of a semiconductor device included in the transmitter 200, and estimate the saturation power $P_{sat}$ and the linear gain $G_{lin}$ corresponding to the received operating conditions f_CUR, T_CUR, and C_CUR by accessing the first calibration data 711 stored in the memory 700'.

The control signal generator 840 may receive the estimated saturation power PEST and the estimated linear gain G_EST from the power and gain estimator 820 and generate control signals C_DP and C_TX based on, for example, the second and third calibration data 712 and 713 stored in the memory 700'. For example, the control signal generator 840 may calculate a saturation power difference between the estimated saturation power of the transmitter 200 and a target saturation power and a linear gain difference between the estimated linear gain of the transmitter 200 and a target linear gain, and generate control signals C_DP and C_TX by accessing the second and third calibration data 712 and 713 to compensate for the saturation power difference and the linear gain difference. For example, the control signal generator 840 may generate a data processor control signal C_DP for adjusting the transmitter voltage V_TX based on the second calibration data 712 to compensate for the saturation power difference. Further, the control signal generator 840 may generate a data processor control signal C_DP and/or a transmitter control signal C_TX for adjusting sizes (e.g. amplitudes) of the transmitter input signal TX_IN and/or the transmitter output signal TX_OUT based on the third calibration data 713 to compensate for an offset of the linear gain due to the compensation of the saturation power difference. Details of the control signal generator 840 will be described with reference to FIG. 7 and the like.

As described above with reference to FIG. 1, when the controller 800' includes a processor which executes instructions, each of the power and gain estimator 820 and the control signal generator 840 may be a software module including a series of instructions that are executed by the controller. On the other hand, when the controller 800' includes a logic circuit generated by logic synthesis, each of the power and gain estimator 820 and the control signal generator 840 may be a hardware module including a plurality of logic gates.

Figure 3B:
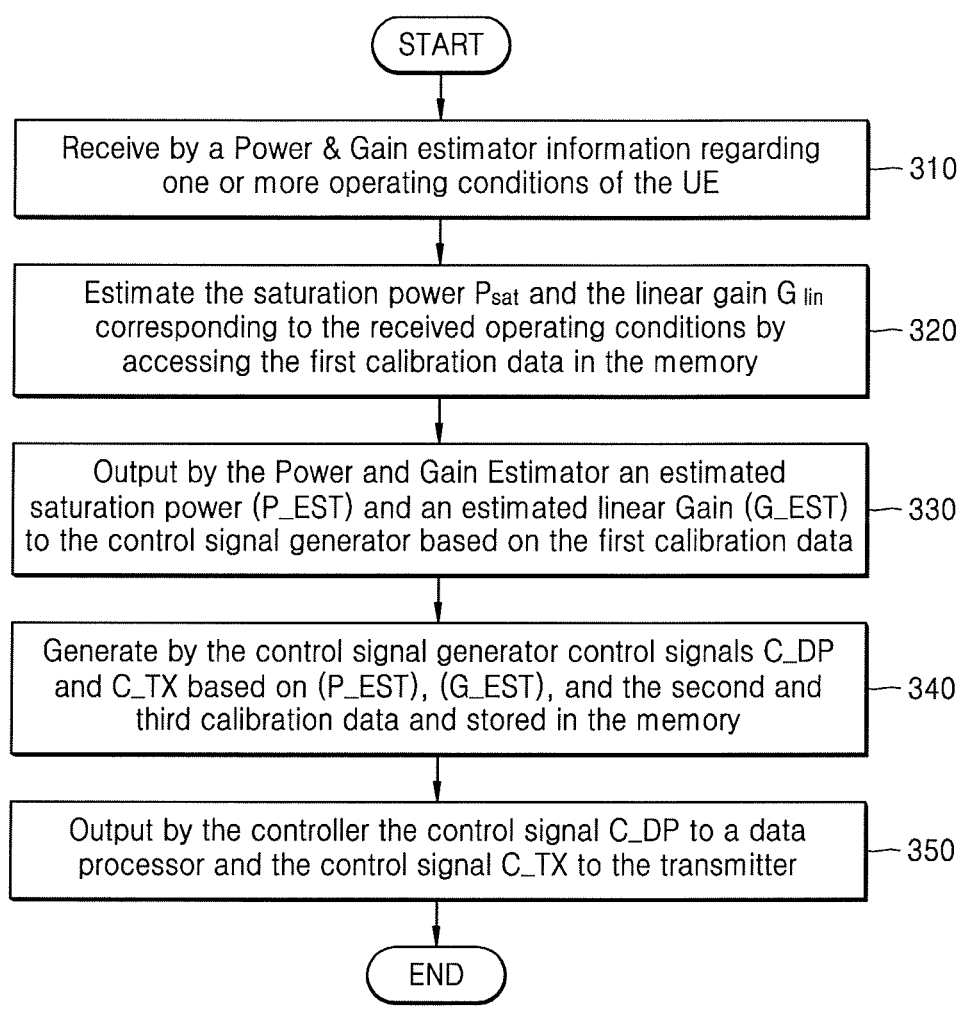
FIG. 3B is a flowchart illustrating operations of a controller according to an exemplary embodiment of the inventive concept.

FIG. 3B is a flowchart illustrating operations of a controller according to an exemplary embodiment of the inventive concept.

At operation 310, one or more operating conditions (e.g. a carrier frequency, a temperature of the transmitter sensed by a temperature sensor, a semiconductor class information) of the transmitter (e.g. transmitter 200) may be provided to a power and gain estimator (e.g. power and gain estimator 820). In addition, calibration data of a reference device that is stored in a memory (e.g. memory 700' shown in FIG. 3A) may have been previously provided to the power and gain estimator, or can be provided upon or after the information regarding operating conditions are provided to the power and gain estimator.

At operation 320 the Power and Gain estimator estimates the saturation power (P_EST) and the linear gain (G_EST) corresponding to the received operation conditions by accessing first calibration data.

At operation 330, the Power and Gain Estimator may output an estimated saturation power (P_EST) and output an estimated linear Gain (G_EST) to the control signal generator based on the first calibration data At operation 340, the control signal generator generates control outputs signals C_DP and C_TX based on the estimated saturation power, estimated Linear Gain, and second and third calibration data and stored in the memory.

At operation 350, the controller outputs control signal C_DP to a data processor, and outputs control signal C_TX to the transmitter.

Figure 4:
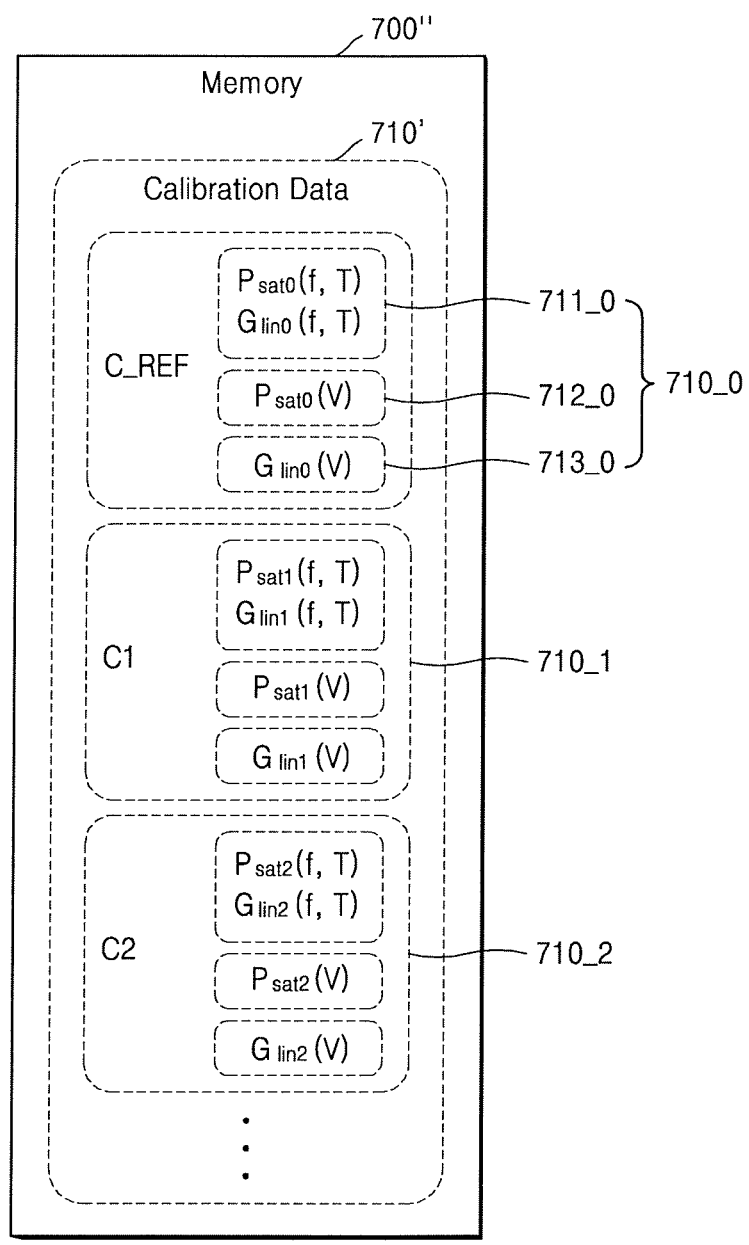
FIG. 4 is a block diagram illustrating an example of the memory according to an exemplary embodiment of the inventive concept.

FIG. 4 is a block diagram illustrating an example of the memory 700 of FIG. 1 according to an exemplary embodiment of the inventive concept. As described above with reference to FIG. 3A, a memory 700" of FIG. 4 may store calibration data 710".

According to the exemplary embodiment of the inventive concept, the memory 700" may store groups of (e.g. first to third) calibration data according to a class of a semiconductor device. For example, as illustrated in FIG. 4, the calibration data 710" stored in the memory 700" may include data groups 710_0, 710_1, and 710_2, and the data groups 710_0, 710_1, and 710_2 may correspond to the classes C_REF, C1, and C2 of the semiconductor device included in the transmitter 200 of FIG. 1, respectively. For example, since the performance of the transmitter 200 may vary according to operating conditions, for example, a frequency, a temperature, a supply voltage, and the like may be different according to a class of a semiconductor device included in the transmitter 200, the memory 700" may store the first to third calibration data according to the class of the semiconductor device. For example, the data group 710_0 corresponding to a reference class C_REF may include functions '$P_{sat0}(f, T)$' and '$G_{lin0}(f, T)$' as first data 711_0, a function '$P_{sat0}(V)$' a function as second data 712_0, and a function '$G_{lin0}(V)$' as third data 713_0.

Figure 5A:
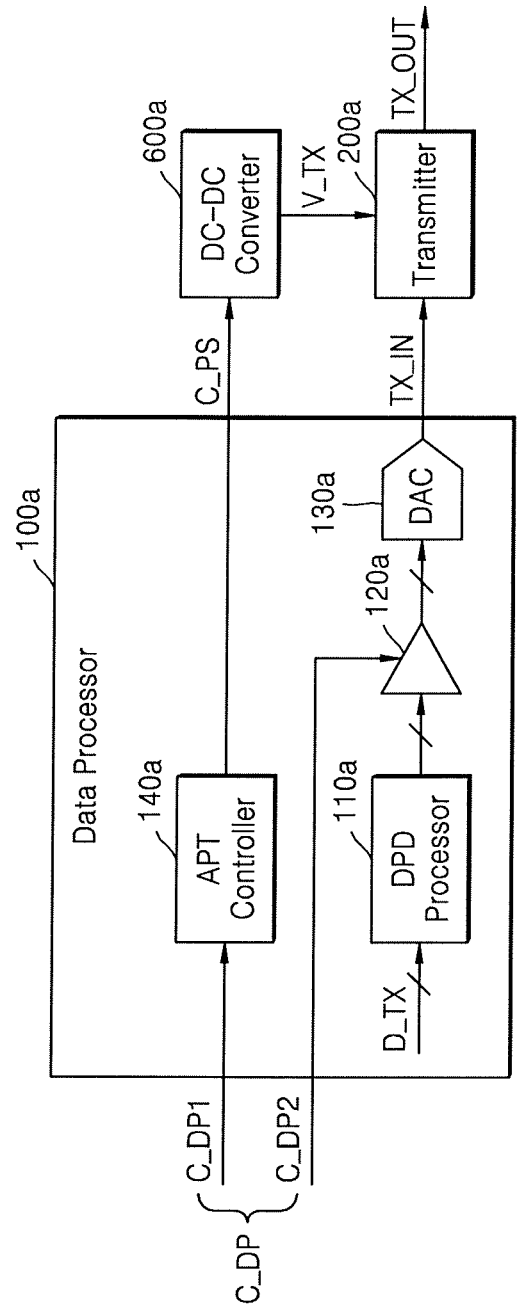
FIGS. 5A and 5B are block diagrams illustrating examples of a data processor and a power supply of FIG. 1 according to exemplary embodiments of the inventive concept.
Figure 5B:
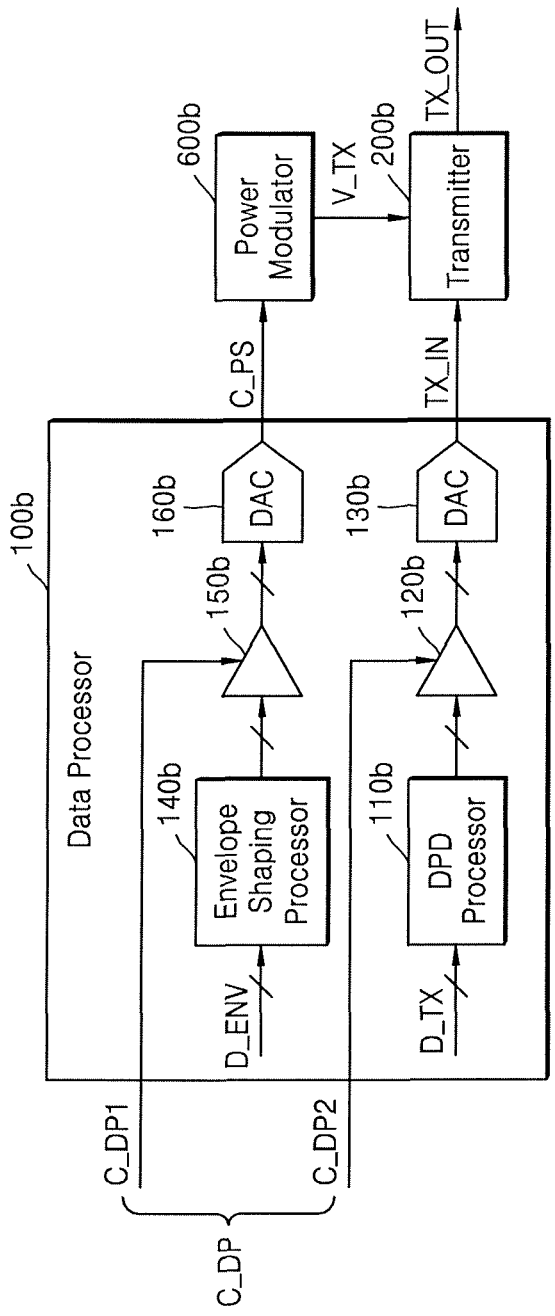

FIGS. 5A and 5B are block diagrams illustrating examples of the data processor 100 and the power supply 600 of FIG. 1 according to exemplary embodiments of the inventive concept. As described above with reference to FIG. 1, the data processor 100 may output the transmitter power control signal C_PS for controlling the power supply 600 as well as the transmitter input signal TX_IN. Hereinafter, description identical to those of FIGS. 5A and 5B will be omitted.

Referring to FIG. 5A, according to the exemplary embodiment of the inventive concept, a transmitter 200a may be controlled by an average power tracking (APT) method. For example, as illustrated in FIG. 5A, the power supply 600 of FIG. 1 may include a DC-to-DC converter 600a and a data processor 100a may include an APT controller 140a for controlling the DC-to-DC converter 600a. The APT controller 140a may estimate an average power of a transmitter output signal TX_OUT based on source data D_TX and/or a transmitter input signal TX_IN and generate a transmitter power control signal C_PS (which is a digital signal or an analog signal) so that a transmitter voltage V_TX is increased or decreased according to the estimated average power. The DC-to-DC converter 600a may increase or decrease the transmitter voltage V_TX in response to the transmitter power control signal C_PS, and thus power loss that may occur when the transmitter 200a has a low output power may be prevented.

As illustrated in FIG. 5A, the Average Power Tracking (APT) controller 140a may receive a first data processor control signal C_DP1 included in a data processor control signal C_DP. The first data processor control signal C_DP1 may be received from the controller 800 of FIG. 1 and the APT controller 140a may generate a transmitter power control signal C_PS in response to the first data processor control signal C_DP1. For example, the APT controller 140a may generate a transmitter power control signal C_PS based on the first data processor control signal C_DP1 as well as the estimated average power of the transmitter output signal TX_OUT. Thus, as described below with reference to FIG. 7 and the like, the first data processor control signal C_DP1 generated by the controller 800 to compensate for a saturation power difference may be reflected in the transmitter voltage V_TX.

The data processor 100a may include a digital predistortion (DPD) processor 110a, a digital amplifier 120a, and a digital-to-analog converter (DAC) 130a to generate a transmitter input signal TX_IN from the source data D_TX. The DPD processor 110a may refer to a processor which applies distortion to the transmitter input signal TX_IN in a direction opposite to characteristics of the transmitter 200a can offset non-linearity that may occur in the transmitter 200a, e.g., non-linearity of the transmitter output signal TX_OUT with respect to the transmitter input signal TX_IN. The DPD processor 110a may output a digital signal by processing the source data D_TX.

The digital amplifier 120a may amplify an output signal of the DPD processor 110a and output the amplified digital signal to the DAC 130a. As illustrated in FIG. 5A, the digital amplifier 120a may receive a second data processor control signal C_DP2 included in the data processor control signal C_DP and adjust a gain in response to the second data processor control signal C_DP2. For example, the second data processor control signal C_DP2 may be a digital signal, and the digital amplifier 120a may adjust the gain to a predetermined step size in response to the second data processor control signal C_DP2. Thus, as described below with reference to FIG. 7 and the like, the second data processor control signal C_DP2, which is generated by the controller 800 to compensate for an offset of a linear gain due to the compensation of the saturation power difference, may be reflected in a size (e.g. amplitude) of the transmitter input signal TX_IN. The DAC 130a may output the transmitter input signal TX_IN, which is an analog signal, by converting a digital signal output from the digital amplifier 120a.

Although FIG. 5A illustrates an example in which the second data processor control signal C_DP2 is provided to the digital amplifier 120a disposed between the DPD processor 110a and the DAC 130a, the second data processor control signal C_DP2 may be provided to the other components of the data processor 100a that may adjust the size of the transmitter input signal TX_IN. For example, the second data processor control signal C_DP2 may be provided to another digital amplifier included in the data processor 100a, for example, a digital amplifier disposed at a front end of the DPD processor 110a, and may be used to adjust a reference voltage of the DAC 130a by being provided to the DAC 130a.

Referring to FIG. 5B, according to the exemplary embodiment of the inventive concept, a transmitter 200b may be controlled by an envelope tracking (ET) method. For example, as illustrated in FIG. 5B, the power supply 600 of FIG. 1 may include a power modulator 600b and a data processor 100b may include components for controlling the power modulator 600b, e.g., an envelope shape processor 140b, a digital amplifier 150b, and a DAC 160b. The envelope shaping processor 140b may receive envelope data D_ENV generated by estimating an envelope of the transmitter output signal TX_OUT and process the envelope data D_ENV so that the transmitter voltage V_TX has an envelope shape according to the envelope data D_ENV. A digital signal output from the envelope shape processor 140b may be amplified by the digital amplifier 150b, and the DAC 160b may generate a transmitter power control signal C_PS by converting an output signal of the digital amplifier 150b into an analog signal.

As illustrated in FIG. 5B, the digital amplifier 150b disposed between the envelope shaping processor 140b and the DAC 160b may receive a first data processor control signal C_DP1 included in a data processor control signal C_DP. The first data processor control signal C_DP1 may be received from the controller 800 of FIG. 1, and the digital amplifier 150b may adjust a size of the output signal of the envelope shape processor 140b in response to the first data processor control signal C_DP1. For example, the first data processor control signal C_DP1 may be a digital signal, and the digital amplifier 150b may adjust a gain to a predetermined step size in response to the first data processor control signal C_DP1. Thus, as described below with reference to FIG. 7 and the like, the first data processor control signal C_DP1 generated by the controller 800 may compensate for a saturation power difference may be reflected in the transmitter voltage V_TX.

A DPD processor 110b, a digital amplifier 120b, and a DAC 130b, which are included in the data processor 100b, may operate in the same or a similar manner as corresponding components in the example of FIG. 5A.

Figure 6A:
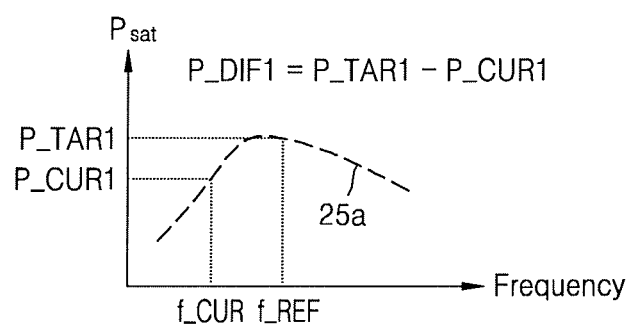
FIGS. 6A and 6B are graphs illustrating operations for estimating a current saturation power and linear gain of a transmitter in accordance with variation of a carrier frequency of a transmitter output signal of FIG. 1 according to an exemplary embodiment of the inventive concept.
Figure 6B:
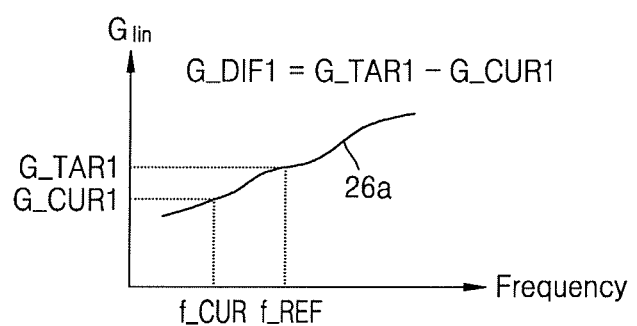
Figure 7:
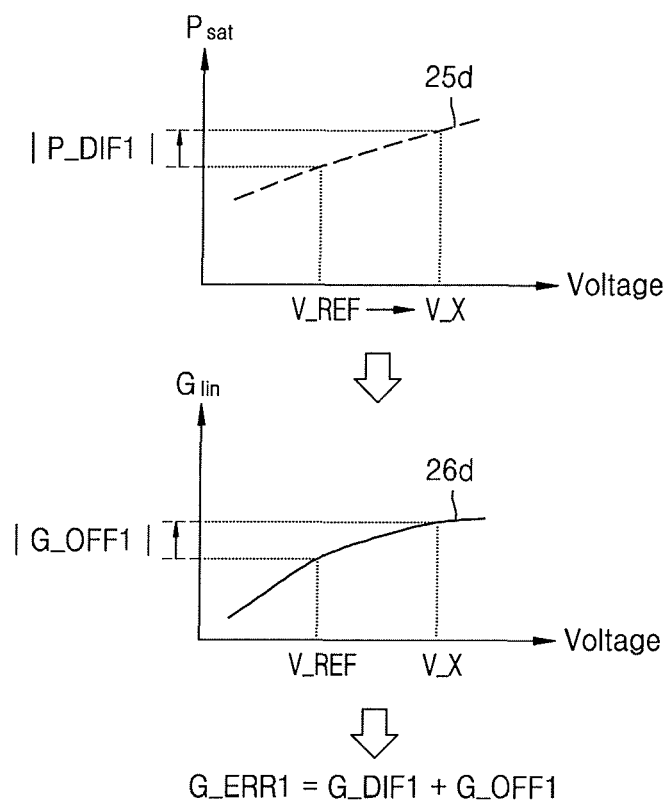
FIG. 7 illustrates graphs illustrating operations of compensating for a saturation power difference and a linear gain difference based on an estimated saturation power and an estimated linear gain according to an exemplary embodiment of the inventive concept.

FIGS. 6A and 6B are graphs illustrating operations for estimating a current saturation power and linear gain of the transmitter 200 in accordance with variation of a carrier frequency of the transmitter output signal TX_OUT of FIG. 1 according to an exemplary embodiment of the inventive concept, and FIG. 7 illustrates graphs illustrating operations of compensating for a saturation power difference and a linear gain difference based on an estimated saturation power and an estimated linear gain according to the exemplary embodiment of the inventive concept. For example, estimation operations illustrated in FIGS. 6A and 6B may be performed by the power and gain estimator 820 included in the controller 800' of FIG. 3 and compensation operations illustrated in FIG. 7 may be performed by the control signal generator 840 included in the controller 800' of FIG. 3A. Hereinafter, FIGS. 6A, 6B, and 7 will be described with reference to FIG. 3A.

Referring to FIG. 6A, the power and gain estimator 820 may estimate the saturation power difference due to the frequency variation by accessing the first calibration data 711 stored in the memory 700'. For example, the first calibration data 711 may include data corresponding to the line 25a in a graph of a frequency with respect to a saturation power illustrated in FIG. 6A, and the power and gain estimator 820 may estimate a saturation power P_CUR1 according to a current frequency f_CUR of the transmitter 200 based on the first calibration data 711. Thus, a saturation power difference P_DIF1, which is a difference between the saturation power P_CUR1 according to the current frequency f_CUR of the transmitter 200 and a saturation power P_TAR1 (or a target saturation power) according to the reference frequency f_REF of the transmitter 200, may be calculated.

Referring to FIG. 6B, the power and gain estimator 820 may estimate the linear gain difference due to the frequency variation by accessing the first calibration data 711 stored in the memory 700'. For example, the first calibration data 711 may include data corresponding to the line 26a in a graph of a frequency with respect to a linear gain illustrated in FIG. 6B, and the power and gain estimator 820 may estimate a linear gain G_CUR1 according to the current frequency f_CUR of the transmitter 200 based on the first calibration data 711. Thus, a linear gain difference G_DIF1, which is a difference between the linear gain G_CUR1 according to the current frequency f_CUR of the transmitter 200 and a linear gain G_TAR1 (or a target linear gain) according to the reference frequency f_REF of the transmitter 200, may be calculated.

Referring to FIG. 7, the control signal generator 840 may generate a control signal for compensating for the saturation power difference P_DIF1 of FIG. 6A due to the frequency variation by accessing the second calibration data 712 stored in the memory 700'. For example, the second calibration data 712 may include data corresponding to the line 25d in a graph of a voltage with respect to a saturation power illustrated in FIG. 7, and the control signal generator 840 may estimate a size of the transmitter voltage V_TX for compensating for the saturation power difference P_DIF1, e.g., a voltage V_X, based on the second calibration data 712. For example, the control signal generator 840 may estimate the voltage V_X corresponding to a saturation power which is moved by the saturation power difference P_DIF1 from a saturation power corresponding to the reference voltage V_REF. Thus, the control signal generator 840 may generate a control signal, for example, the first data processor control signal C_DP1 of FIGS. 5A and 5B, so that the transmitter voltage V_TX becomes the voltage V_X.

Referring to FIG. 7, the control signal generator 840 may estimate a linear gain offset G_OFF1 due to the compensation of the saturation power difference P_DIF1 by accessing the third calibration data 713 stored in the memory 700'. For example, the third calibration data 713 may include data corresponding to the line 26d in a graph of a voltage with respect to a linear gain illustrated in FIG. 7, and the control signal generator 840 may estimate the linear gain offset G_OFF1 based on the third calibration data 713. For example, the control signal generator 840 may estimate the linear gain offset G_OFF1 from a difference between a linear gain corresponding to the reference voltage V_REF and a linear gain corresponding to the voltage V_X for compensating for the saturation power difference P_DIF1.

As illustrated in FIG. 7, the control signal generator 840 may calculate a linear gain error G_ERR1 as a sum of the linear gain difference G_DIF1 of FIG. 6B due to the frequency variation and the linear gain offset G_OFF1. The control signal generator 840 may generate a control signal for adjusting sizes of the transmitter input signal TX_IN and/or the transmitter output signal TX_OUT so that the linear gain error G_ERR1 is compensated. For example, the control signal generator 840 may generate the second data processor control signal C_DP2 of FIGS. 5A and 5B to adjust the size of the transmitter input signal TX_IN, and/or generate the transmitter control signal C_TX for adjusting a gain of an amplifier included in the RF circuits 220 of FIG. 1 to adjust the size of the transmitter output signal TX_OUT. Thus, the linear gain error G_ERR1 may be compensated.

Figure 8A:
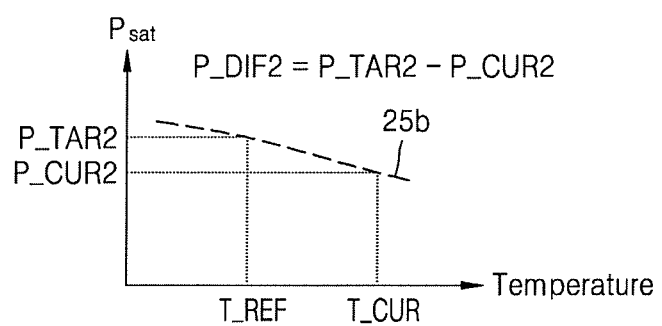
FIGS. 8A and 8B are graphs illustrating operations for estimating a current saturation power and linear gain of a transmitter in accordance with a variation of a temperature of the transmitter according to an exemplary embodiment of the inventive concept.
Figure 8B:
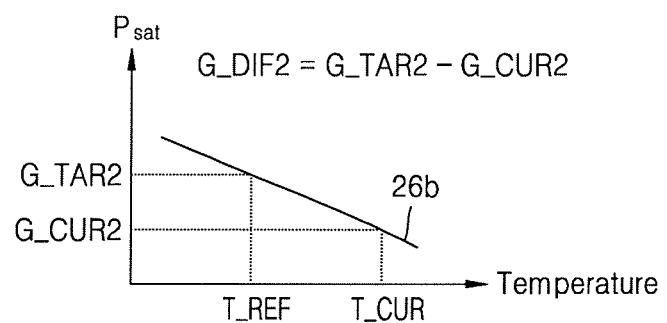
Figure 9:
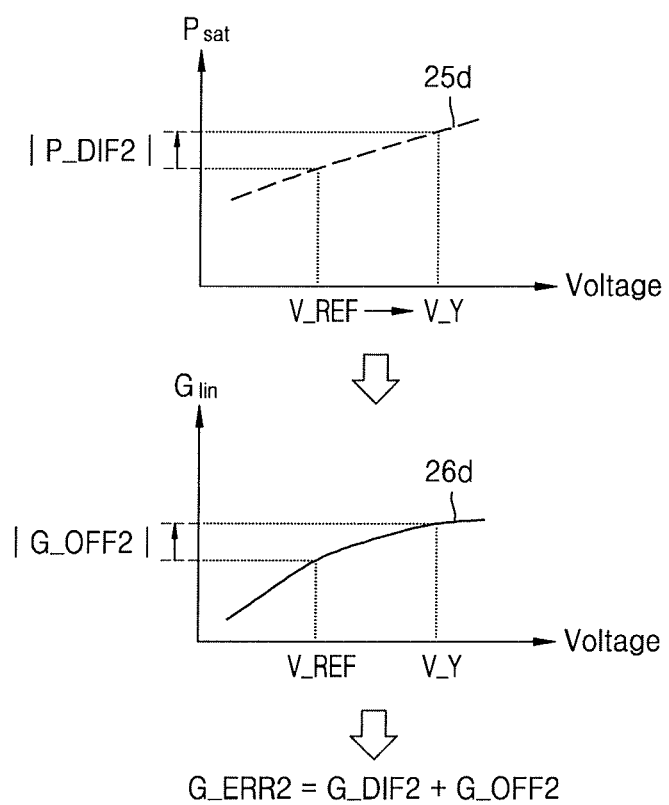
FIG. 9 illustrates graphs illustrating operations of compensating for a saturation power difference and a linear gain difference based on an estimated saturation power and an estimated linear gain according to an exemplary embodiment of the inventive concept.

FIGS. 8A and 8B are graphs illustrating operations for estimating a current saturation power and linear gain of the transmitter 200 of FIG. 1 in accordance with variation of a temperature of the transmitter 200 according to an exemplary embodiment of the inventive concept, and FIG. 9 illustrates graphs illustrating operations for compensating for a saturation power difference and a linear gain difference based on an estimated saturation power and an estimated linear gain according to the exemplary embodiment of the inventive concept. For example, estimation operations illustrated in FIGS. 8A and 8B may be performed by the power and gain estimator 820 included in the controller 800' of FIG. 3A and compensation operations illustrated in FIG. 9 may be performed by the control signal generator 840 included in the controller 800' of FIG. 3A. Hereinafter, FIGS. 8A, 8B, and 9 will be described with reference to FIG. 3A.

Referring to FIG. 8A, the power and gain estimator 820 may estimate the saturation power difference due to the temperature variation by accessing the first calibration data 711 stored in the memory 700'. For example, the first calibration data 711 may include data corresponding to the line 25b in a graph of a temperature with respect to a saturation power illustrated in FIG. 8A, and the power and gain estimator 820 may estimate a saturation power P_CUR2 according to a current temperature T_CUR of the transmitter 200 based on the first calibration data 711. Thus, a saturation power difference P_DIF2, which is a difference between the saturation power P_CUR2 according to the current temperature T_CUR of the transmitter 200 and a saturation power P_TAR2 (or a target saturation power) according to the reference temperature T_REF of the transmitter 200, may be calculated.

Referring to FIG. 8B, the power and gain estimator 820 may estimate the linear gain difference due to the temperature variation by accessing the first calibration data 711 stored in the memory 700'. For example, the first calibration data 711 may include data corresponding to the line 26b in a graph of a temperature with respect to a linear gain illustrated in FIG. 8B, and the power and gain estimator 820 may estimate a linear gain G_CUR2 according to the current temperature T_CUR of the transmitter 200 based on the first calibration data 711. Thus, a linear gain difference G_DIF2, which is a difference between the linear gain G_CUR2 according to the current temperature T_CUR of the transmitter 200 and a linear gain G_TAR2 (or a target linear gain) according to the reference temperature T_REF of the transmitter 200, may be calculated.

Referring to FIG. 9, the control signal generator 840 may generate a control signal for compensating for the saturation power difference P_DIF2 of FIG. 8A due to the temperature variation by accessing the second calibration data 712 stored in the memory 700'. For example, the second calibration data 712 may include data corresponding to the line 25d in a graph of a voltage with respect to a saturation power illustrated in FIG. 9, and the control signal generator 840 may estimate a size of the transmitter voltage V_TX for compensating for the saturation power difference P_DIF2, e.g., a voltage V_Y, based on the second calibration data 712. Thus, the control signal generator 840 may estimate the voltage V_Y corresponding to the saturation power which is moved by the saturation power difference P_DIF2 from a saturation power corresponding to the reference voltage V_REF. Thus, the control signal generator 840 may generate a control signal, for example, the first data processor control signal C_DP1 of FIGS. 5A and 5B so that the transmitter voltage V_TX becomes the voltage V_Y.

Referring to FIG. 9, the control signal generator 840 may estimate a linear gain offset G_OFF2 due to the compensation of the saturation power difference P_DIF2 by referring to the third calibration data 713 stored in the memory 700'. For example, the third calibration data 713 may include data corresponding to the line 26d in a graph of a voltage with respect to a linear gain illustrated in FIG. 9, and the control signal generator 840 may estimate the linear gain offset G_OFF2 by referring to the third calibration data 713. For example, the control signal generator 840 may estimate the linear gain offset G_OFF2 from a difference between a linear gain corresponding to the reference voltage V_REF and a linear gain corresponding to the voltage V_Y for compensating for the saturation power difference P_DIF2.

As illustrated in FIG. 9, the control signal generator 840 may calculate a linear gain error G_ERR2 as a sum of the linear gain difference G_DIF2 of FIG. 8B due to the temperature variation and the linear gain offset G_OFF2. The control signal generator 840 may generate a control signal for adjusting sizes of the transmitter input signal TX_IN and/or the transmitter output signal TX_OUT so that the linear gain error G_ERR2 is compensated. For example, the control signal generator 840 may generate the second data processor control signal C_DP2 of FIGS. 5A and 5B to adjust the size of the transmitter input signal TX_IN, and/or generate the transmitter control signal C_TX for adjusting a gain of the amplifier included in the RF circuits 220 of FIG.

1 to adjust the size (e.g. amplitude, value) of the transmitter output signal TX_OUT. Thus, the linear gain error G_ERR2 may be compensated.

Figure 10A:
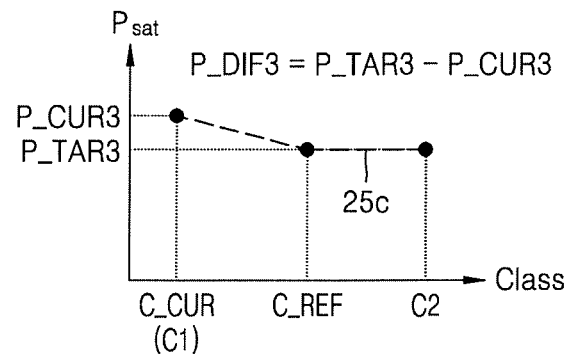
FIGS. 10A and 10B are graphs illustrating operations for estimating a current saturation power and linear gain of a transmitter of in accordance with a class of a semiconductor device included in the transmitter according to an exemplary embodiment of the inventive concept.
Figure 10B:
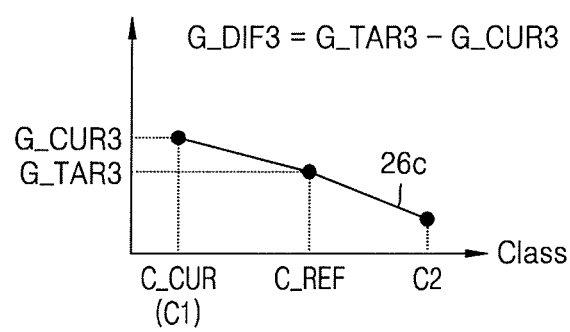
Figure 11:
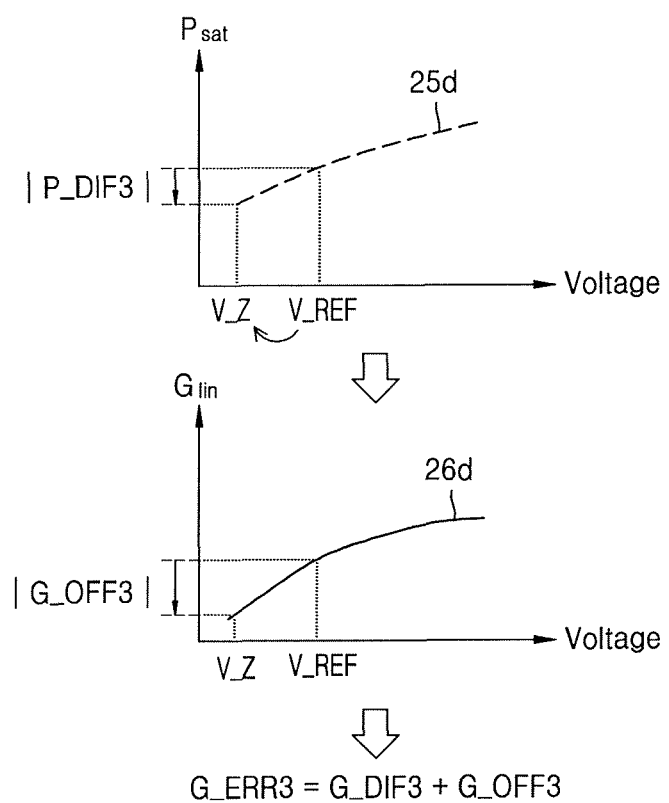
FIG. 11 illustrates graphs illustrating operations of compensating for a saturation power difference and a linear gain difference based on an estimated saturation power and an estimated linear gain according to an exemplary embodiment of the inventive concept.

FIGS. 10A and 10B are graphs illustrating operations for estimating a current saturation power and linear gain of the transmitter 200 of FIG. 1 in accordance with a class of a semiconductor device included in the transmitter 200 according to an exemplary embodiment of the inventive concept, and FIG. 11 illustrates graphs illustrating operations of compensating for a saturation power difference and a linear gain difference based on an estimated saturation power and an estimated linear gain according to the exemplary embodiment of the inventive concept. For example, estimation operations illustrated in FIGS. 10A and 10B may be performed by the power and gain estimator 820 included in the controller 800' of FIG. 3A and compensation operations illustrated in FIG. 11 may be performed by the control signal generator 840 included in the controller 800' of FIG. 3A. Hereinafter, FIGS. 10A, 10B, and 11 will be described with reference to FIG. 3A.

Referring to FIG. 10A, the power and gain estimator 820 may estimate the saturation power difference due to the class of the semiconductor device by accessing (e.g. retrieving) the first calibration data 711 stored in the memory 700'. For example, the first calibration data 711 may include data corresponding to the line 25c in a graph of a class of a semiconductor device with respect to a saturation power illustrated in FIG. 10A, and the power and gain estimator 820 may estimate a saturation power P_CUR3 according to a class C_CUR of the semiconductor device included in the transmitter 200 based on the first calibration data 711. Thus, a saturation power difference P_DIF3, which is a difference between the saturation power P_CUR3 according to the class C_CUR of the semiconductor device included in the transmitter 200 and a saturation power P_TAR3 (or a target saturation power) according to the reference class C_REF of the semiconductor device, may be calculated.

Referring to FIG. 10B, the power and gain estimator 820 may estimate the linear gain difference due to the class of the semiconductor device of the transmitter 200 by accessing the first calibration data 711 stored in the memory 700'. For example, the first calibration data 711 may include data corresponding to the line 26c in a graph of a class of a semiconductor device with respect to a linear gain illustrated in FIG. 10B, and the power and gain estimator 820 may estimate a linear gain G_CUR3 according to the class C_CUR of the semiconductor device included in the transmitter 200 based on the first calibration data 711. Thus, a linear gain difference G_DIF3 which is a difference between the linear gain G_CUR3 according to the class C_CUR of the semiconductor device included in the transmitter 200 and a linear gain G_TAR3 (or a target linear gain) according to the reference class C_REF of the semiconductor device, may be calculated.

Referring to FIG. 11, the control signal generator 840 may generate a control signal for compensating for the saturation power difference P_DIF3 of FIG. 10A due to the class of the semiconductor device included in the transmitter 200 by accessing the second calibration data 712 stored in the memory 700'. For example, the second calibration data 712 may include data corresponding to the line 25d in a graph of a voltage with respect to a saturation power illustrated in FIG. 11, and the control signal generator 840 may estimate a size of the transmitter voltage V_TX for compensating for the saturation power difference P_DIF3, e.g., a voltage V_Z, based on the second calibration data 712. For example, the control signal generator 840 may estimate the voltage V_Z corresponding to the saturation power which is moved by the saturation power difference P_DIF3 from a saturation power corresponding to the reference voltage V_REF. Thus, the control signal generator 840 may generate a control signal, for example, the first data processor control signal C_DP1 of FIGS. 5A and 5B so that the transmitter voltage V_TX becomes the voltage V_Z.

Referring to FIG. 11, the control signal generator 840 may estimate a linear gain offset G_OFF3 due to the compensation of the saturation power difference P_DIF3 by accessing the third calibration data 713 stored in the memory 700'. For example, the third calibration data 713 may include data corresponding to the line 26d in a graph of a voltage with respect to a linear gain illustrated in FIG. 11, and the control signal generator 840 may estimate the linear gain offset G_OFF3 based in part on the third calibration data 713. For example, the control signal generator 840 may estimate the linear gain offset G_OFF3 from a difference between a linear gain corresponding to the reference voltage V_REF and a linear gain corresponding to the voltage V_Z for compensating for the saturation power difference P_DIF3.

As illustrated in FIG. 11, the control signal generator 840 may calculate a linear gain error G_ERR3 as a sum of the linear gain difference G_DIF3 of FIG. 10B due to the class of the semiconductor device of the transmitter 200 and the linear gain offset G_OFF3. The control signal generator 840 may generate a control signal for adjusting sizes of the transmitter input signal TX_IN and/or the transmitter output signal TX_OUT so that the linear gain error G_ERR3 is compensated. For example, the control signal generator 840 may generate the second data processor control signal C_DP2 of FIGS. 5A and 5B to adjust the size of the transmitter input signal TX_IN, and/or generate the transmitter control signal C_TX for adjusting the gain of the amplifier included in the RF circuits 220 of FIG. 1 to adjust the size of the transmitter output signal TX_OUT. Thus, the linear gain error G_ERR3 may be compensated.

Figure 12:
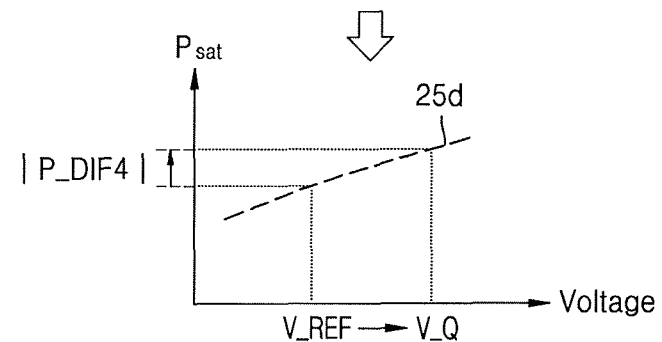
FIG. 12 illustrates graphs illustrating operations of compensating for a saturation power difference and a linear gain difference based on an estimated saturation power and an estimated linear gain according to an exemplary embodiment of the inventive concept.
Figure 12:
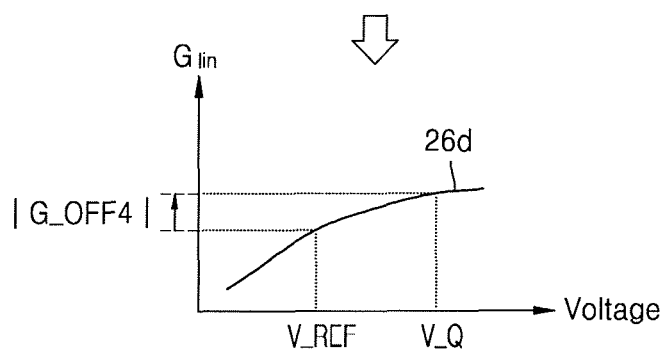

FIG. 12 illustrates graphs illustrating operations of compensating for a saturation power difference and a linear gain difference based on an estimated saturation power and an estimated linear gain according to an exemplary embodiment of the inventive concept. Specifically, FIG. 12 illustrates graphs illustrating operations of compensating for an estimated current saturation power and linear gain of the transmitter 200 with a target saturation power and a target linear gain based on variation of a carrier frequency of the transmitter output signal TX_OUT, variation of a temperature of the transmitter 200, and a class of a semiconductor device included in the transmitter 200 of FIG. 1. Saturation power differences P_DIF1, P_DIF2, and P_DIF3 and linear gain differences G_DIF1, G_DIF2, and G_DIF3, which are illustrated in FIG. 12, may be the same as those described with reference to FIGS. 6A, 6B, 8A, 8B, 10A, and 10B. For example, the compensation operations illustrated in FIG. 12 may be performed by the control signal generator 840 included in the controller 800' of FIG. 3A, and FIG. 12 will be discussed with reference to FIG. 3A.

According to the exemplary embodiment of the inventive concept, the control signal generator 840 may generate a control signal for compensating for variations of two or more operating conditions. For example, as illustrated in FIG. 12, the saturation power differences P_DIF1, P_DIF2, and P_DIF3 and the linear gain differences G_DIF1, G_DIF2, and G_DIF3 may be calculated from the saturation power and the linear gain, which are estimated according to the frequency, the temperature, and the class of the semiconductor device by the power and gain estimator 820 of FIG. 3A, and thus a resulting saturation power difference P_DIF4 and a resulting linear gain difference G_DIF4 may be calculated.

Similar to the illustrations shown in FIGS. 7, 9, and 11, the control signal generator 840 may generate a control signal for compensating for the saturation power difference P_DIF4 due to the variations of the operating conditions by accessing the second calibration data 712 stored in the memory 700'. For example, the second calibration data 712 may include data corresponding to the line 25*d* in a graph of a voltage with respect to a saturation power illustrated in FIG. 12, and the control signal generator 840 may estimate a size of the transmitter voltage V_TX for compensating for the saturation power difference P_DIF4, e.g., a voltage V_Q, based on the second calibration data 712. For example, the control signal generator 840 may estimate the voltage V_Q corresponding to the saturation power which is moved by the saturation power difference P_DIF4 from a saturation power corresponding to the reference voltage V_REF. Thus, the control signal generator 840 may generate a control signal, for example, the first data processor control signal C_DP1 of FIGS. 5A and 5B so that the transmitter voltage V_TX becomes the voltage V_Q.

Referring to FIG. 12, the control signal generator 840 may estimate a linear gain offset G_OFF4 due to the compensation of the saturation power difference P_DIF4 by accessing the third calibration data 713 stored in the memory 700'. For example, the third calibration data 713 may include data corresponding to the line 26*d* in a graph of a voltage with respect to a linear gain illustrated in FIG. 12, and the control signal generator 840 may estimate the linear gain offset G_OFF4 based on the third calibration data 713. For example, the control signal generator 840 may estimate the linear gain offset G_OFF4 from a difference between a linear gain corresponding to the reference voltage V_REF and a linear gain corresponding to the voltage V_Q for compensating for the saturation power difference P_DIF4.

As illustrated in FIG. 12, the control signal generator 840 may calculate a linear gain error G_ERR4 as a sum of the linear gain difference G_DIF4 due to the variations of the operating conditions and the linear gain offset G_OFF4. The control signal generator 840 may generate a control signal for adjusting sizes of the transmitter input signal TX_IN and/or the transmitter output signal TX_OUT so that the linear gain error G_ERR4 may be compensated. For example, the control signal generator 840 may generate the second data processor control signal C_DP2 of FIGS. 5A and 5B to adjust the size of the transmitter input signal TX_IN, and/or generate the transmitter control signal C_TX for adjusting the gain of the amplifier included in the RF circuits 220 of FIG. 1 to adjust the size of the transmitter output signal TX_OUT. Thus, the linear gain error G_ERR4 may be compensated.

Although FIG. 12 illustrates an example that considers all three operating conditions, it will be understood that the exemplary embodiments of the inventive concept may be applied to compensate for variations of two operating conditions or more than three operating conditions.

Figure 13:
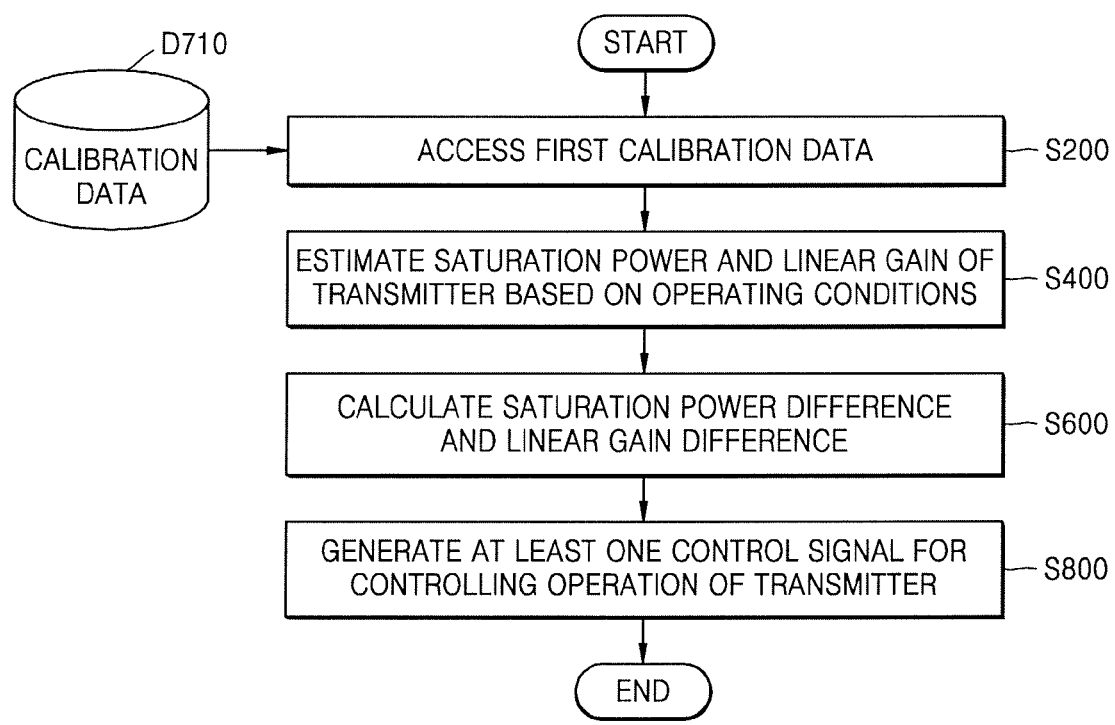
FIG. 13 is a flowchart illustrating a method for controlling wireless transmission according to an exemplary embodiment of the inventive concept.

FIG. 13 is a flowchart illustrating a method for controlling wireless transmission according to an exemplary embodiment of the inventive concept. For example, the method of FIG. 13 may be performed by the controller 800 of FIG. 1, and hereinafter, FIG. 13 will be described with reference to FIG. 1.

In operation S200, an operation of accessing first calibration data may be performed. Calibration data D710 may include first calibration data, and the first calibration data may represent a saturation power $P_{sat}$ and a linear gain $G_{lin}$, of a reference transmitter as functions of operating conditions of the reference transmitter. For example, as described above with reference to FIG. 3A, the first calibration data may include functions '$P_{sat}(f, T, C)$' and '$G_{lin}(f, T, C)$' respectively represent the saturation power $P_{sat}$ and the linear gain $G_{lin}$ of the reference transmitter as functions of a carrier frequency f of an output signal provided by the reference transmitter, a temperature T of the reference transmitter, and a class C according to characteristics of a semiconductor device of the reference transmitter. The controller 800 of FIG. 1 may access the first calibration data by accessing the calibration data 710 stored in the memory 700.

In operation S400, an operation of estimating the saturation power and linear gain of the transmitter based on the operating conditions may be performed. For example, the controller 800 may receive information on the carrier frequency of the transmitter output signal TX_OUT, the temperature of the transmitter 200, and the class of the semiconductor device included in the transmitter 200, and estimate a current saturation power and linear gain of the transmitter 200 by accessing the first calibration data based on the received information.

In operation S600, an operation of calculating a saturation power difference and a linear gain difference may be performed. For example, the controller 800 may obtain a saturation power (or a target saturation power) and a linear gain (or a target linear gain) according to reference operating conditions by accessing the first calibration data. Next, the controller 800 may calculate a saturation power difference from a difference between the saturation power estimated in operation S400 and a target saturation power, and calculate a linear gain difference from a difference between the linear gain estimated in operation S400 and a target linear gain.

In operation S800, an operation of generating at least one control signal for controlling operations of the transmitter may be performed. For example, the controller 800 may provide a data processor control signal C_DP to the data processor 100 which generates a transmitter input signal TX_IN and provide a transmitter control signal C_TX to the transmitter 200 to compensate for the saturation power difference and the linear gain difference. The operations of the transmitter 200 may be controlled according to the control signals C_DP and C_TX generated by the controller 800 and the variations of the operating conditions may be compensated. Details of operation S800 will be described with reference to FIG. 14.

Figure 14:
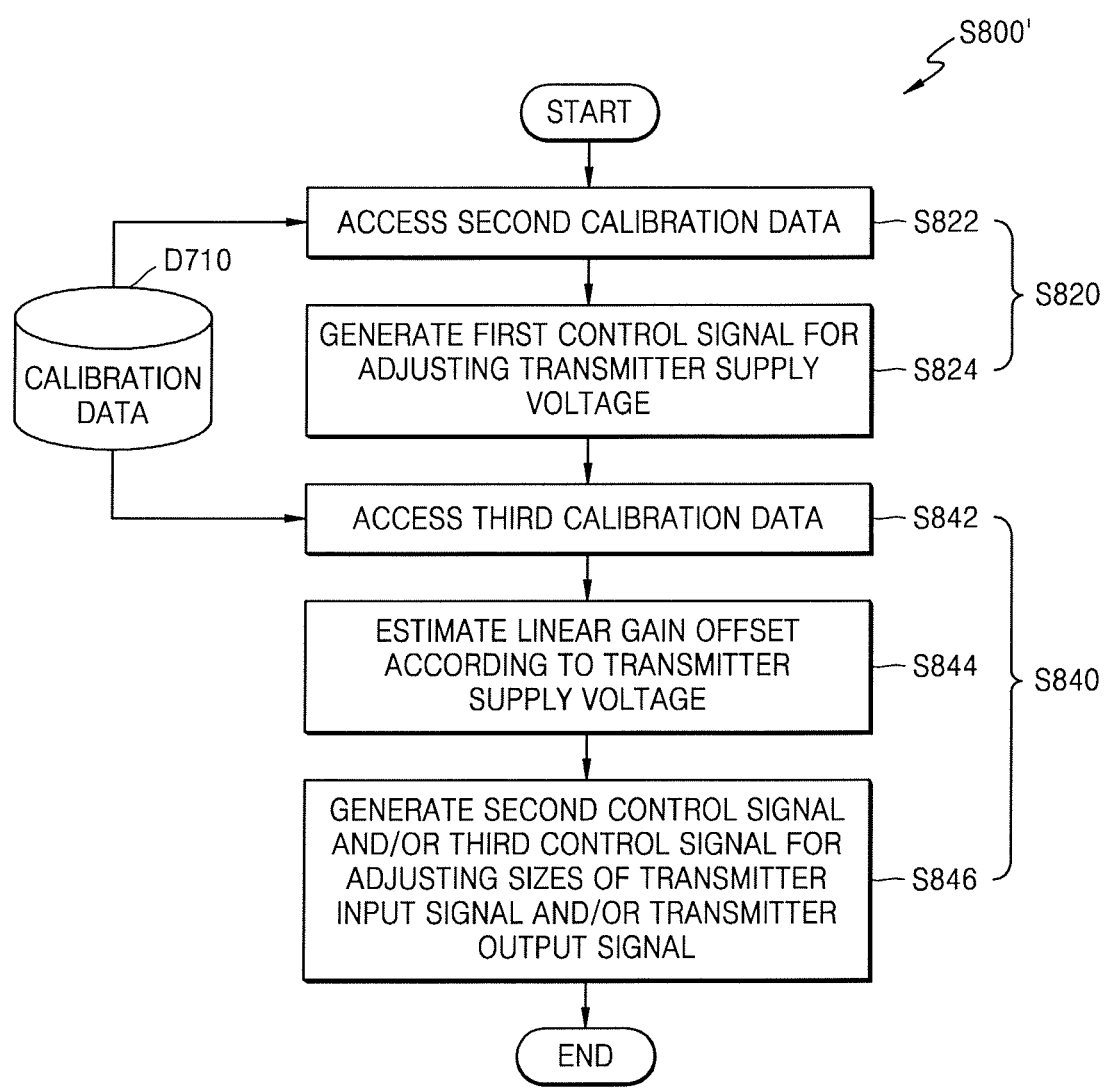
FIG. 14 is a flowchart illustrating an example of operation S800 of FIG. 13 according to an exemplary embodiment of the inventive concept.

FIG. 14 is a flowchart illustrating an example of operation S800 of FIG. 13 according to an exemplary embodiment of the inventive concept. As described above with reference to FIG. 13, in operation S800' of FIG. 14, an operation of generating at least one control signal for controlling the operations of the transmitter may be performed. For example, operation S800' of FIG. 14 may be performed by the control signal generator 840 included in the controller 800' of FIG. 3A, and hereinafter, FIG. 14 will be described with reference to FIG. 3A.

According to the exemplary embodiment of the inventive concept, the operation of generating at least one control signal for controlling the operations of the transmitter may include an operation of generating a control signal to compensate for the saturation power difference in operation S820, and an operation of generating a control signal to compensate for the linear gain offset and the linear gain difference due to the compensation of the saturation power difference in operation S840. As illustrated in FIG. 14, operation S820 may include operations S822 and S824, and operation S840 may include operations S842, S844, and S846.

In operation S822, an operation of accessing a second calibration data may be performed. The calibration data D710 may include second calibration data, and the second calibration data may include a function '$P_{sat}(V)$' representing a saturation power $P_{sat}$ of the reference transmitter as a function of the supply voltage V provided to the reference transmitter as described above with reference to FIG. 3A. The control signal generator 840 of FIG. 3A may access the second calibration data 712 stored in the memory 700'.

In operation S824, an operation of generating a first control signal for adjusting a transmitter supply voltage may be performed. For example, the control signal generator 840 may determine a size of a transmitter supply voltage V_TX that may be used to compensate for a saturation power difference by referring to the second calibration data. For example, the control signal generator 840 may generate a first control signal for controlling the transmitter supply voltage V_TX with a voltage corresponding to a saturation power in which a saturation power difference is reflected in a saturation power corresponding to a reference voltage. For example, the first control signal may be the first data processor control signal C_DP1 of FIGS. 5A and 5B. The supply voltage of the transmitter may be supplied to a power amplifier included in the transmitter and thus an output power of the power amplifier may be controlled according to the first control signal.

In operation S842, an operation of accessing third calibration data may be performed. The calibration data D710 may include third calibration data (e.g. FIG. 3A, third calibration 713) and the third calibration data may include a function '$G_{lin}(V)$' representing a linear gain $G_{lin}$ of the reference transmitter as a function of the supply voltage V provided to the reference transmitter as described above with reference to FIG. 3A.

In operation S844, an operation of estimating a linear gain offset according to a transmitter supply voltage may be performed. Since the supply voltage of the transmitter is changed to compensate for the saturation power difference based on the second calibration data in operation S824, a change of the linear gain due to the changed transmitter supply voltage, e.g., a linear gain offset, may be estimated based on the third calibration data. For example, the control signal generator 840 may estimate the linear gain offset as a difference between a linear gain corresponding to the reference voltage and a linear gain corresponding to the changed transmitter supply voltage.

In operation S846, an operation of generating a second control signal and/or a third control signal for adjusting sizes of a transmitter input signal and/or a transmitter output signal may be performed. In operation S844, a linear gain error may be estimated from the estimated linear gain and the linear gain difference (which is estimated in operation S600 of FIG. 13), and the second control signal and/or the third control signal for adjusting the sizes of the transmitter input signal and/or the transmitter output signal may be generated to compensate for the estimated linear gain error. For example, the second data processor control signal C_DP2 may be generated as a second control signal to adjust the size of the transmitter input signal TX_IN as described above with reference to FIGS. 5A and 5B, and the transmitter control signal C_TX for changing a gain of the amplifier included in the RF circuits 220 of the transmitter 200 may be generated as a third control signal to adjust the size of the transmitter output signal TX_OUT as illustrated in FIG. 1. The second control signal may digitally control the gain and the third control signal may analogously control the gain may be generated in association with each other to accurately adjust the linear gain error (or with a high resolution).

Figure 15:
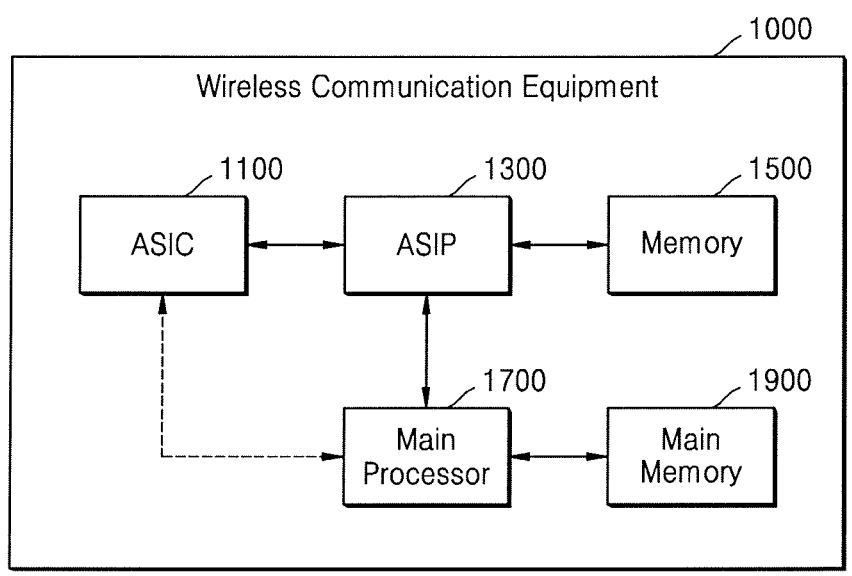
FIG. 15 is a block diagram exemplarily illustrating a wireless communication device according to an exemplary embodiment of the inventive concept.

FIG. 15 is a block diagram exemplarily illustrating a wireless communication device 1000 according to an exemplary embodiment of the inventive concept. As illustrated in FIG. 15, the wireless communication device 1000 may include an application specific integrated circuit (ASIC) 1100, an application specific instruction set processor (ASIP) 1300, a memory 1500, a main processor 1700, and a main memory 1900. Two or more among the ASIC 1100, the ASIP 1300, and the main processor 1700 may communicate with each other. Further, at least two of the ASIC 1100, the ASIP 1300, the memory 1500, the main processor 1700, and the main memory 1900 may be embedded into a single chip.

The ASIP 1300 may be a customized integrated circuit for a particular application, support a dedicated instruction set for a particular application, and execute instructions included in the instruction set. The memory 1500 may communicate with the ASIP 1300 and store a plurality of instructions executed by the ASIP 1300 as non-volatile storage. For example, the memory 1500 may include any type of memory accessible by the ASIP 1300, such as a random access memory (RAM), a read only memory (ROM), a tape, a magnetic disk, an optical disk, a volatile memory, a non-volatile memory, and a combination thereof, as a non-limiting example.

The main processor 1700 may control the wireless communication device 1000 by executing a plurality of instructions. For example, the main processor 1700 may control the ASIC 1100 and the ASIP 1300, and process data received through the wireless communication network or process an input from a user of the wireless communication device 1000. The main memory 1900 may communicate with the main processor 1700 and store a plurality of instructions executed by the main processor 1700 as non-volatile storage. For example, the main memory 1900 may include any type of memory accessible by the main processor 1700, such as a RAM, a ROM, a tape, a magnetic disk, an optical disk, a volatile memory, a non-volatile memory, and a combination thereof, as a non-limiting example.

The above-described method for controlling the wireless transmission according to the exemplary embodiment of the inventive concept may be performed by at least one of components included in the wireless communication device 1000 of FIG. 15. For example, the operation of the controller 800 of FIG. 1 or at least one of the operations of the method for controlling the wireless transmission of FIG. 13 may be implemented as a plurality of instructions stored in the memory 1500, and the ASIP 1300 may perform the operation of the controller 800 or at least one of the operations of the method for controlling the wireless transmission of FIG. 13 by executing the plurality of instructions stored in the memory 1500. As another example, the operation of the controller 800 of FIG. 1 or at least one of the operations of the method for controlling the wireless transmission of FIG. 13 may be implemented as a hardware block designed through logic synthesis or the like and included in the ASIC 1100. As still another example, the operation of the controller 800 of FIG. 1 or at least one of the operations of the method for controlling the wireless transmission of FIG. 13 may be implemented as a plurality of instructions stored in the main memory 1900, and the main processor 1700 may perform the operation of the controller 800 of FIG. 1 or at least one of the operations of the method for controlling the wireless transmission of FIG. 13 by executing the plurality of instructions stored in the main memory 1900.

While the inventive concept has been particularly shown and described with reference to one or more embodiments thereof, it will be understood that various changes in form and details may be made therein without departing from the spirit and scope of the following claims as defined by the appended claims.

What is claimed is:

1. An apparatus for wireless transmission, the apparatus comprising:
   a controller;
   a transmitter coupled to the controller, in which the transmitter includes RF circuits that receive a baseband input signal of a source data and increases a frequency of the baseband input signal to an RF signal band that is amplified by a power amplifier to generate an output signal;
   a memory configured to store first calibration data representing a saturation power and a linear gain of a reference device according to a plurality of operating conditions of the reference device; and
   wherein the controller receives information about operating conditions of the transmitter, and in which the controller is configured to estimate a linear gain and a saturation power of the transmitter based on the operating conditions of the transmitter and the first calibration data, and wherein the controller generates at least one control signal to control an operation of the transmitter based on a saturation power difference between the estimated saturation power and a target saturation power and a linear gain difference between the estimated linear gain and a target linear gain.

2. The apparatus according to claim 1, wherein the reference device comprises a reference transmitter, and the first calibration data is based on one or more functions executed by the reference transmitter.

3. The apparatus of claim 2, wherein the first calibration data comprising information regarding operating conditions of the reference transmitter including at least one of a carrier frequency of an output signal provided by the reference transmitter, a temperature of the reference transmitter, and a class according to characteristics of a semiconductor device included in the reference transmitter.

4. The apparatus of claim 2, wherein:
   the memory is further configured to store second calibration data representing a saturation power of the reference transmitter as a function of a supply voltage provided to a power amplifier included in the reference transmitter; and
   the at least one control signal generated by the controller comprises a first control signal to adjust a supply voltage of a power amplifier included in the transmitter of the apparatus based on the second calibration data so that the saturation power difference is compensated.

5. The apparatus of claim 4, further comprising:
   a direct current-to-direct current (DC-to-DC) converter that outputs a voltage to the power amplifier included in the transmitter of the apparatus, in which the output voltage of the DC-to-DC converter is controlled according to an average power of the output signal; and
   wherein the controller generates the first control signal for controlling the DC-to-DC converter.

6. The apparatus of claim 4, wherein:
   the supply voltage of the power amplifier included in the transmitter of the apparatus is provided by a power modulator of which an output voltage is instantaneously controlled according to an amplitude of the output signal; and
   the controller generates the first control signal that controls the power modulator.

7. The apparatus of claim 4, wherein:
   the memory stores third calibration data representing a linear gain of the reference transmitter as a function of the supply voltage provided to the power amplifier included in the reference transmitter; and
   the controller estimates an offset of the linear gain due to the supply voltage adjusted to compensate for the saturation power difference based on the third calibration data and generates at least one control signal for adjusting an amplitude of at least one of the input signal and the output signal so that the linear gain difference and the estimated offset of the linear gain are compensated.

8. The apparatus of claim 7, wherein the controller generates a second control signal provided to a data processor which outputs the input signal by processing a digital signal to adjust the amplitude of the input signal.

9. The apparatus of claim 7, wherein the transmitter of the apparatus includes a variable gain amplifier, and controller generates a third control signal provided to the variable gain amplifier to adjust the amplitude of the output signal.

10. The apparatus of claim 7, wherein:
    the transmitter of the apparatus is the reference transmitter; and
    the first to third calibration data are generated by testing the transmitter of the apparatus.

11. The apparatus of claim 2, wherein:
    the target saturation power and the target linear gain comprise a saturation power and a linear gain which are included in the reference transmitter under reference operating conditions; and
    the controller extracts the target saturation power and the target linear gain from the first calibration data based on the reference operating conditions.

12. A method for controlling a transmitter of an apparatus which provides an output signal by upconverting and amplifying an input signal, the method comprising:
    accessing first calibration data representing a linear gain and a saturation power of a reference transmitter according to operating conditions of the reference transmitter;
    estimating a saturation power and a linear gain of the transmitter of the apparatus based on operating conditions of the transmitter of the apparatus and the first calibration data of the reference transmitter;
    calculating a saturation power difference between the estimated saturation power and a target saturation power;
    calculating a linear gain difference between the estimated linear gain and a target linear gain; and
    generating at least one control signal to control an operation of the transmitter of the apparatus based on the calculated saturation power difference and the calculated linear gain difference.

13. The method of claim 12, wherein the estimating of the saturation power and linear gain of the transmitter includes an operation of obtaining at least one of the operating conditions of the transmitter of the apparatus including a carrier frequency of the output signal provided by the transmitter, a temperature of the transmitter, and a class according to characteristics of a semiconductor device included in the transmitter.

14. The method of claim 12, wherein the generating of the at least one control signal includes:
accessing second calibration data representing a saturation power of the reference transmitter as a function of a supply voltage provided to a power amplifier included in the reference transmitter; and
generating a first control signal to adjust a supply voltage of a power amplifier included in the transmitter based on the second calibration data so that the saturation power difference is compensated.

15. The method of claim 14, wherein the generating of the at least one control signal includes:
accessing third calibration data representing a linear gain of the reference transmitter as a function of the supply voltage provided to the power amplifier included in the reference transmitter;
estimating an offset of the linear gain due to the supply voltage adjusted to compensate for the saturation power difference based on the third calibration data; and
generating at least one control signal for adjusting an amplitude of at least one of the input signal and the output signal so that the linear gain difference and the estimated offset of the linear gain are compensated.

16. The method of claim 12, wherein:
the target saturation power and the target linear gain comprise a saturation power and a linear gain which are included in the reference transmitter under reference operating conditions; and
the calculating of the saturation power difference and the linear gain difference includes extracting the target saturation power and the target linear gain from the first calibration data based on the reference operating conditions.

17. A user equipment (UE) that controls wireless transmissions, comprising:
a transmitter including at least one RF circuit;
a data processor coupled to the transmitter and includes circuitry that generates an input signal to the transmitter;
a memory configured to store calibration data representing a linear gain of a reference device and a saturation power at which the linear gain decreases from a maximum under one or more operating conditions;
a controller coupled to the transmitter, the controller generates a control signal output to the transmitter, in which the control signal adjusts operation of the transmitter based on one or more operating conditions of the transmitter and a calibration data of the reference device; and
wherein the controller generates at least one control signal to control an operation of the transmitter based on a saturation power difference between an estimated saturation power and a target saturation power and a linear gain difference between an estimated linear gain and a target linear gain.

18. The UE according to claim 17, further comprising:
a power supply coupled to at least the data processor and the transmitter; and
the data processor generates a transmitter power control signal to control an output of power from the power supply to the transmitter.

19. The UE according to claim 17, wherein the calibration data comprises data obtained from testing the reference device under a plurality of operational conditions.

20. The UE according to claim 17, wherein the reference device comprises a reference transmitter manufactured by a same process as that of the transmitter of the UE.

* * * * *